United States Patent
Forbes et al.

(10) Patent No.: US 6,320,222 B1
(45) Date of Patent: *Nov. 20, 2001

(54) STRUCTURE AND METHOD FOR REDUCING THRESHOLD VOLTAGE VARIATIONS DUE TO DOPANT FLUCTUATIONS

(75) Inventors: Leonard Forbes, Corvallis, OR (US); Wendell P. Noble, Milton, VT (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,202

(22) Filed: Sep. 1, 1998

(51) Int. Cl.[7] .................................................. H01L 31/113
(52) U.S. Cl. ............................................ 257/331; 257/365
(58) Field of Search ................................. 257/365, 328, 257/329, 330, 331, 332

(56) References Cited

U.S. PATENT DOCUMENTS

| | | | |
|---|---|---|---|
| 4,605,909 | 8/1986 | Tsironis | 331/96 |
| 5,057,896 | 10/1991 | Gotou | 357/49 |
| 5,391,895 | 2/1995 | Dreifus | 257/77 |
| 5,653,619 | 8/1997 | Cloud et al. | 445/24 |
| 5,661,424 | 8/1997 | Tang | 327/105 |
| 5,675,164 | * 10/1997 | Brunner et al. | 257/331 |
| 5,998,834 | * 12/1999 | Williams et al. | 257/330 |
| 6,060,746 | * 5/2000 | Bertin et al. | 257/331 |

FOREIGN PATENT DOCUMENTS

| | | | |
|---|---|---|---|
| 4370978 | 12/1992 | (JP) | H01L/29/784 |

OTHER PUBLICATIONS

Sze, S.M., Physics of Semiconductor Devices, Wiley and Sons, 1981, pp 362–379, 433–438.*

Colinge, J.P., "Reduction of Kink Effect in Thin–Film SOI MOSFET's", *IEEE Electron Device Letters*, 9 (2), pp. 97–99, (1988).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17 (11), 509–511, (Nov. 1996).

Nishinohara, K., et al., "Effects of Microscopic Fluctuations in Dopant Distributions on MOSFET Threshold Voltage", *IEEE Transactions on Electron Devices*, 39(3), pp. 634–639, (Mar. 1992).

Stolk, P.A., et al., "The Effect of Statistical Dopant Fluctuations on MOS Device Performance", *IEEE*, pp. 23.4.1–23.4.4, (1996).

(List continued on next page.)

*Primary Examiner*—Sara Crane
(74) *Attorney, Agent, or Firm*—Schwegman, Lundberg, Woessner & Kluth, P.A.

(57) ABSTRACT

An improved method and structure are provided for MOSFETs which reduce or eliminate the effects of statistical dopant fluctuations. The device includes a dual-gated FET which can be fabricated using current CMOS processing tools and process steps. The dual-gated MOSFET that has two gates one on each side of a thin fully depleted silicon structure. The silicon film between the two gates is very thin so the device can be fully depleted. In addition, the new device desirably provided improved performance regardless of channel length variations. The method and structure offer a future generation of sub-0.5 $\mu$m, uniform, and low threshold voltage ($V_t$) MOSFETs with an increased range of application, e.g. to include uses in production drivers and clock drivers with uniform characteristics and delays.

22 Claims, 24 Drawing Sheets

OTHER PUBLICATIONS

Takeuchi, K., et al., "Channel Engineering for the Reduction of Random–Dopant–Placement–Induced Threshold Voltage Fluctuations", *IEEE*, pp. 33.6.1–33.6.4, (1997).

Taur, Y., et al., "CMOS Devices below 0.1 micrometer: How High Will Performance Go?", *IEEE*, pp. 9.1.1–9.1.4, (1997).

Wong, H.S., et al., "Self–Aligned (Top and Bottom) Double– Gate MOSFET with a 25 nm Thick Silicon Channel", *IEEE*, pp. 16.6.1–16.6.4, (1997).

Wong, H.S., et al., "Three–Dimensional "Atomistic" Simulation of Discrete Random Dopant Distribution Effects in Sub–0.1 micrometer MOSFET's", *IEEE*, pp., 29.2.1–29.2.4, (1993).

GaAs IC Symposium, IEEE Callium Arsenide Integrated Cisuit Symposim, 19th Annual Technical Digest, Anaheim, California, pp. 1–290, (Oct. 12–15, 1997).

Asai, S., et al., "The GaAs Dual–Gate Fet With Low Noise And Wide Dynamic Range", *Technical Digest, International Electron Devices Meeting*, pp. 64–67, (Dec. 1973).

Mizuno, T., et al., "High Speed and Highly Reliable Trench MOSFET with Dual–Gate", 1988 Symposium on VLSI Technology, Digest of Technical Papers, pp. 23–24, 991, (1988).

* cited by examiner

STRUCTURE AND METHOD FOR REDUCING THRESHOLD VOLTAGE VARIATIONS DUE TO DOPANT FLUCTUATIONS

RELATED APPLICATIONS

This application is related to the co-filed and commonly assigned application, application Ser. No. 09/145,100, entitled "Structure and Method for Improved Signal Processing," U.S. Pat. No. 6,104,068, which is hereby incorporated by reference. Further, this application is related to application Ser. No. 08/889/462, entitled "Memory Cell Having A Vertical Transistor with Buried Source/Drain And Dual Gates," filed Jul. 8, 1997, U.S. Pat. No. 6,150,687 and application Ser. No. 09/050,281, entitled "Circuits and Methods for Dual-Gated Transistors," filed on Mar. 30, 1998, U.S. Pat. No 6,097,065, which applications are also incorporated herein by reference.

FIELD OF THE INVENTION

The present invention relates generally to semiconductor integrated circuits. More particularly, it pertains to a structure and method for reducing threshold voltage variations due to dopant fluctuations.

BACKGROUND OF THE INVENTION

The threshold voltage ($V_t$) tolerance on metal-oxide semiconducting field effect transistor (MOSFET) is an important design parameter in very large scale integrated circuits (VLSI). The threshold voltage ($V_t$) is contributed to mainly by variations in insulator charge, gate oxide thickness, short channel effect, narrow channel effect and macroscopic doping tolerance. The statistical total is typically in the vicinity of 200 mV. As the dimensions of MOSFET devices are reduced, constant field scaling dictates that the doping level within the channel increase in inverse proportion to the device dimension. This means that the number of dopant atoms within the device channel decreases in proportion to the square of the device dimensions. Device operation, dependent upon a forbidden energy gap within the silicon, free of sub-bands, requires that the location of dopant impurity ions within the silicon lattice be completely statistically random. As the number of dopant ions within a device decreases, statistical fluctuations in the random placement of dopant ions will increase from device to device. Since the threshold voltage ($V_t$) of a MOSFET strongly depends on the doping, threshold voltage tolerance due to statistical dopant density fluctuation similarly increases.

It has been shown that for a scaled device design point with a width to length equivalency of 0.1 µm, has an average number of 360 dopant ions within the channel. In a device with these dimensions, a one sigma threshold voltage ($V_t$) tolerance is only 20 mV. In effect, as dimensions continue to decrease, threshold voltage ($V_t$) tolerance in MOSFETs will not only become dominant, but will constitute a practical limit MOSFET dimensional scaling and device application. Also, in this environment, expanded applications for MOSFETs, e.g., in production drivers and clock drivers with uniform characteristics and delays, become especially difficult since circuit timing and delay times become critical as dimensions become smaller and the demand for circuit speeds increases.

One approach to overcoming statistical dopant density fluctuation is to provide a ground plane doping profile wherein a high doping region is buried beneath a near intrinsic layer at the device surface. Although this type of retrograde doping profile does reduce the sensitivity to the doping variations, it negatively increases the sensitivity to short channel effects.

A method to decrease the sensitivity to both doping fluctuations and channel length variations is to completely remove the impurity in the channel. This is accomplished by using intrinsic silicon on insulator (SOI) devices. However, the same requires both very thin silicon films of approximately 20 nanometers (nm) for device length of 0.1 µm, and an alternative means of controlling the threshold voltage ($V_t$) other than by impurity doping. In other words, a processing technology change would be required with a departure from conventional processing tools and steps, or changing the gate material from polysilicon to a metal.

Thus, what is needed is a method and structure for MOSFETs which reduce or eliminate the effects of statistical dopant fluctuations and channel length variations as the dimensions in these devices continue to scale down. Further, it is desirable to develop a method and structure for MOSFETs which can accord these benefits using conventional processing tools and process steps.

SUMMARY OF THE INVENTION

The above mentioned problems with threshold voltage variations and other problems are addressed by the present invention and will be understood by reading and studying the following specification. A structure and method which improves operational reliability and performance is provided.

In particular, an illustrative embodiment of the present invention includes a method of fabricating a transistor on a substrate. The method includes forming a first source/drain region on the substrate. A body region is vertically formed on the first source/drain region. Vertically forming the body region included vertically growing an epitaxial layer. The body region includes opposing sidewall surfaces. A second source drain region is formed on the body region. A first gate is formed on a first one of the opposing sidewall surfaces. And, the method further includes forming a second gate on a second one of the opposing sidewall surfaces.

Another embodiment of the present invention includes a method of fabricating a transistor on a substrate. The method includes forming a first conductivity type first source/drain region on the substrate. A second conductivity type body region is vertically formed on the first source/drain layer. Vertically forming the body region includes vertically growing an epitaxial layer. The body region includes opposing sidewall surfaces. A first conductivity type second source/drain region is formed on the body region layer. A first gate is formed on a first one of the opposing sidewall surfaces. And, a second gate is formed on a second one of the opposing sidewall surfaces.

In another embodiment, a method of fabricating a transistor on a substrate is provided. The method includes vertically forming a body region extending outwardly from the substrate. Vertically forming the body region includes forming the body region as a fully depleted structure. Vertically forming the body region includes forming the body region with opposing sidewall surfaces. A first source/drain region is formed adjacent to the body region. A second source/drain region is similarly formed adjacent to the body region. A first gate is formed on a first one of the opposing sidewall surfaces. Further, a second gate on a second one of the opposing sidewall surfaces.

In another embodiment of the present invention, a dual-gated transistor on a substrate is provided. The dual-gated transistor includes a first source/drain region, a body region, and a second source/drain region. The body region has opposing sidewall surfaces and is a fully depleted structure. A first gate located on a first one of the opposing sidewall surfaces and a second gate located on a second one of the opposing sidewall surfaces. The dual-gated transistor is formed by forming a first source/drain region on the substrate, vertically forming a body region on the first source/drain by vertically growing an epitaxial layer, growing a second source/drain region on the body region, and forming first and second gates on a first and second one of the opposing sidewall surfaces respectively.

In another embodiment of the present invention, a dual-gated transistor on a substrate is provided. The dual-gated transistor includes a first source/drain region, a body region which has opposing sidewall surfaces, and a second source/drain region. The body region is a fully depleted structure. A first gate is located on a first one of the opposing sidewall surfaces. A second gate is located on a second one of the opposing sidewall surfaces. The dual-gated transistor is formed by vertically forming a body region extending outwardly from the substrate, forming a first source/drain region adjacent to the body region and similarly forming a second source/drain region adjacent to the body region. A first gate is formed on a first one of the opposing sidewall surfaces, and a second gate is formed on a second one of the opposing sidewall surfaces.

Thus, an improved method and structure are provided for MOSFETs which reduce or eliminate the effects of statistical dopant fluctuations. The device includes a dual-gated FET which can be fabricated according to a novel processing sequence using current fabrication line CMOS processing tolls and process procedures. Hence, the invention does not require any additional masks, forms, or number of process procedures. The dual-gated MOSFET has two gates one on each side of a thin fully depleted silicon structure, or body. The small volume of the fully depleted body of the dual-gated transistor makes the bulk charge extremely small. The silicon film between the two gates is very thin so the device can be fully depleted. Therefore, the threshold voltage ($V_t$) does not depend on statistical fluctuations in dopant atom concentrations.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
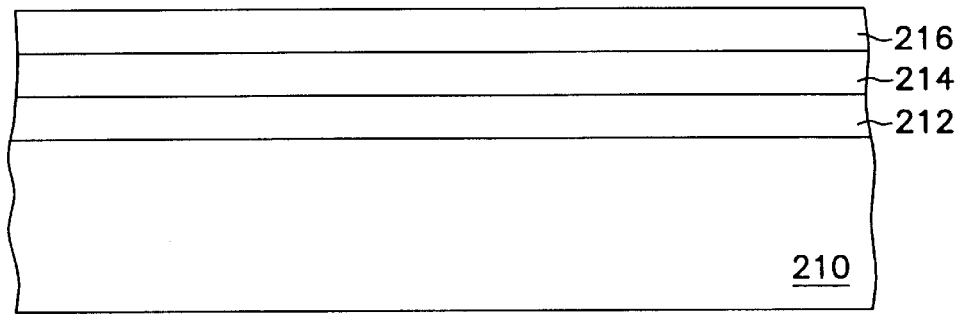
FIGS. 1A–1K illustrate an embodiment of a process of fabrication of a transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrate circuited (IC) structure of the invention. The term substrate is understood to include semiconductor wafers. The term substrate is also used to refer to semiconductor structures during processing, and may include other layers that have been fabricated thereupon. Both ware and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the material referred to as conductors. The following detailed description is, therefore not to be taken in a limiting sense, and the scope of the present invention is defined only by the appended claims, along with the full scope of equivalents to which such claims are entitled.

The term "horizontally" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation of "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n-" and "p-" refer to lightly doped n and p-type semiconductor materials, respectively.

FIGS. 1A–1K illustrate an embodiment of a process of fabrication of a transistor according to the teachings of the present. In the embodiment of FIG. 1A, a p- bulk silicon substrate 210 starting material is used. An n++ and n+ silicon composite first source/drain layer 212 is formed on substrate 210, such as by ion-implantation, epitaxial growth, or a combination of such techniques. The overall thickness of the first source/drain layer 212 can be approximately between 0.2 to 0.5 μm. A body region layer 214 of p- silicon is formed, such as by vertical epitaxial growth, to a thickness that can be about 0.4 μm. A second source/drain region layer 216 of n+ silicon is formed, such as by ion-implantation into body region layer 214 or by opitaxial growth on body region layer 214, to a thickness that can be approximately between 0.2 and 0.5 µm.

In an alternative embodiment the approximate thicknesses provided above for the first source/drain region layer 212, the body region layer 214, and the second source/drain region layer 216 can be proportionally scaled down to provide a sub-micron device which has body region layer 214 thickness of less than 0.2 µm.

Figure 1B:
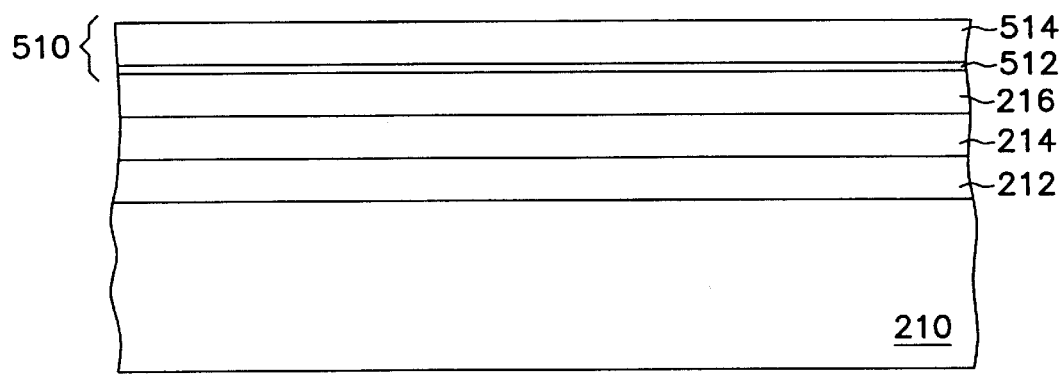

In FIG. 1B, a silicon dioxide ($SiO_2$) thin pad oxide layer 512 is formed on second source/drain region 216, such as by chemical vapor deposition (CVD). In one embodiment, pad oxide layer 512 can be approximately 10 nm in thickness. A think silicon nitride ($Si_3N_4$) layer 514 is formed on pad oxide layer 512, such as by CVD. In one embodiment, nitride layer 514 of can be approximately 100 nm in thickness.

Figure 1C:
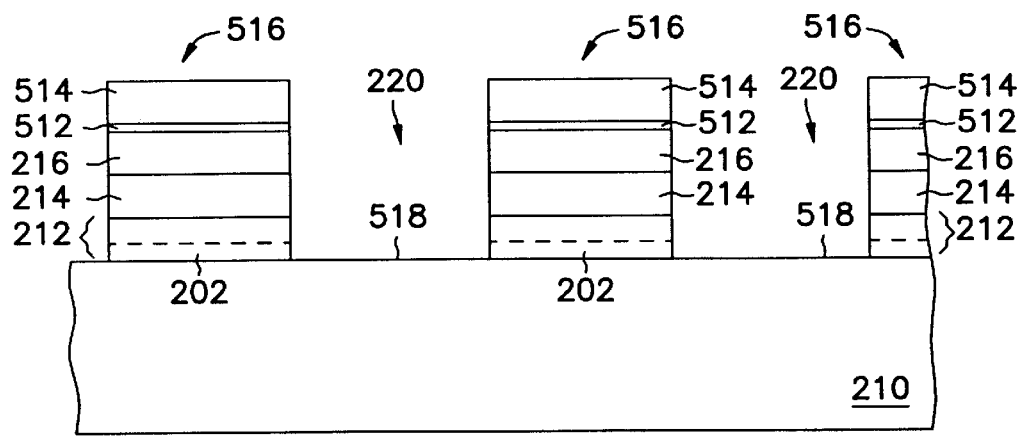

In FIG. 1C, photoresist is applied and selectively exposed to provide a mask for the directional etching of trenches 220, such as by reactive ion etching (RIE). The directional etching results in a plurality of column bars 516 containing the stack of nitride layer 514, pad oxide layer 512, second source/drain layer 216, body region layer 214, and first source/drain layer 212. Trenches 220 are etched to a depth that is sufficient to reach the surface 518 of substrate 210, thereby providing separation between what can serves as conductively doped bit lines 202 beneath the first source/drain region layer 212. Bars 516 are oriented in the direction of bit lines 202. In an exemplary embodiment, bars 516 have a surface line width which is sufficiently thin, vis-a-vis the doping concentration of the body region 214, such that the bulk charge is extremely small, negligible in device operation, and the body region 214 can be fully depleted when a gate potential is applied. The depth and width of each trench 220 can be approximately equal to the line width of bars 516.

Figure 1D:
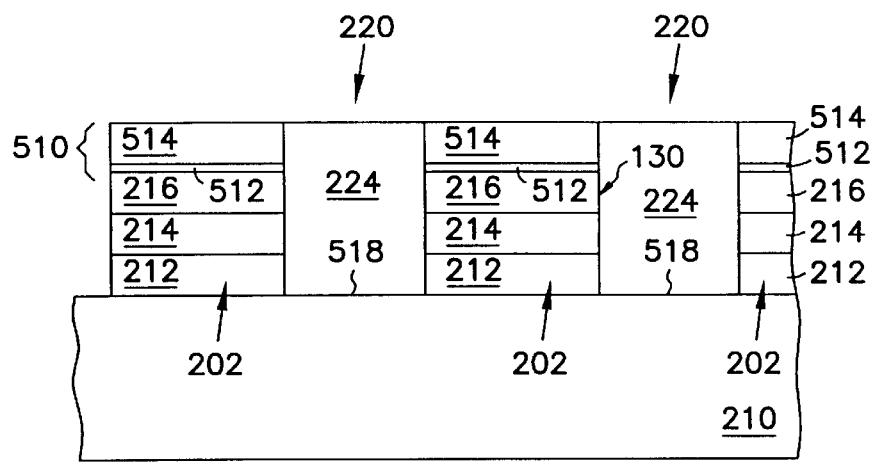

In FIG. 1D, the photoresist is remove. Isolation material 224, such as $SiO_2$ is deposited to fill the trenches 220. The working surface is then planarized, such as by chemical mechanical polishing/planarization (CMP).

Figure 1E:
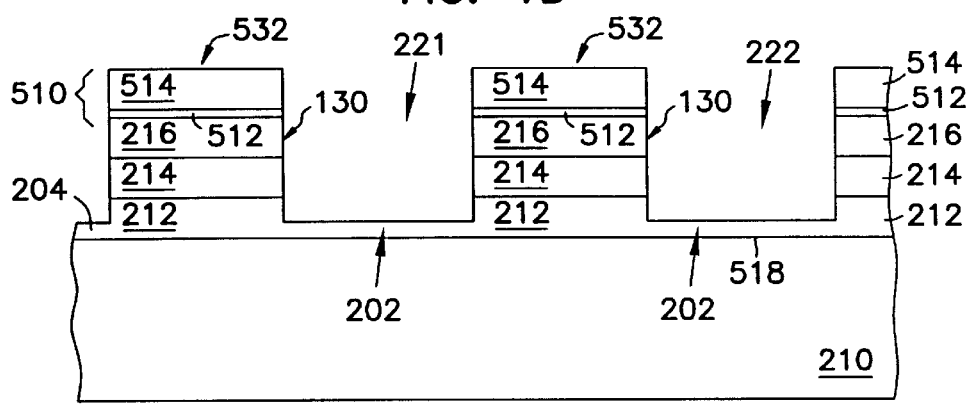

FIG. 1E illustrates the view of FIGS. 1D after clockwise rotation by ninety degrees. In FIG. 1E, a photoresist material is applied and selectively exposed to provide a mask for the directional etching of trenches 221 and 222, such as by reactive ion etching (RIE) of a plurality of row bars 532 that are disposed orthogonally to bitlines 202. Forming trenches 221 and 222 includes etching though stacked layers in the portions of bars 516. Forming trenches 221 and 222 also includes etching through the isolation material 224 disposed between bars 516.

More particularly, trenches 221 and 222 are etched through nitride layer 514, pad oxide layer 512, second source/drain layer 216, body region layer 214, and partially into first source/drain layer 212. Trenches 221 and 222 are etched into bars. 516 to a sufficient depth into first source/drain layer 212 such that the underlying bit line 202 portion of the first source/drain layer 212 is left intact. Trenches 221 and 222 are also etched into the isolation material 224 between bars 516. In one embodiment, after etching nitride layer 514 of bars 516, a nonselective dry etch is used to remove the isolation material 224 between bars 516 and also the pad oxide layer 512, second source/drain 216, body region layer 214, and a portion of first source/drain layer 212 of bars 516. The directional etching of trenches 221 and 222 results in the formation of a plurality of row bars 532 that are orthogonal to column bars 516.

Figure 1F:
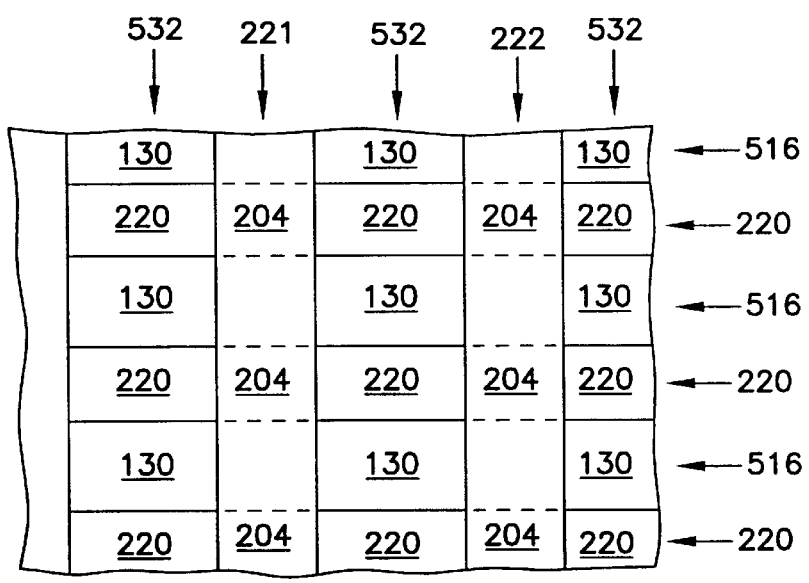

FIG. 1F is a plan view illustration generally the arrangement of parallel bars 516, and trenches 220 interposed therebetween. Bars 532 are arranged orthogonally to bars 516. Trenches 221 and 222 are interposed between ones of bars 532. The resulting semiconductor pillars in the intersecting portions of bars 532 and 516 provide first and second source/drain regions 212 and 216, respectively, and body region 214 for metal-oxide semiconductor field effective transistor (MOSFET) formation.

Figure 1G:
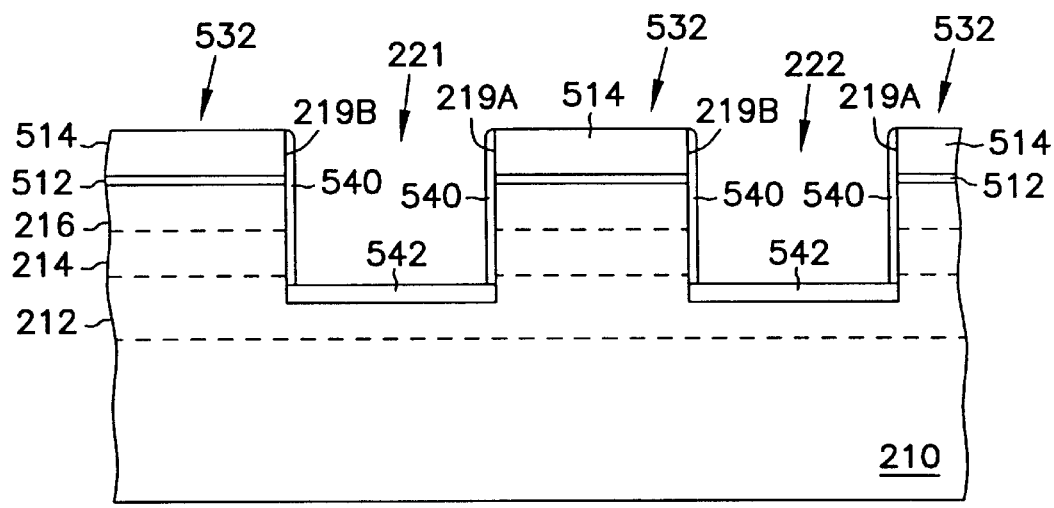

In FIG. 1G, which is oriented similarly to FIG. 1E, a conformal silicon nitride layer 540 is formed, such as by CVD. Nitride layer 540 is directionally etched, such as by RIE, to leave resulting portions of nitride layer 540 only on the first and second opposing sidewalls, 219A, and 219B, of the bars 532 in trenches 221 and 222. In one embodiment, the thickness of nitride layer 540 is about 20 nm. An oxide layer 542 is formed, such as by thermal growth, at the base portions of trenches 221 and 222. Oxide layer 542 insulated the underlying bit lines 202 from structures subsequently formed in trenches 221 and 222. After forming oxide layer 542, remaining portions of nitride layer 540 are removed.

Figure 1H:
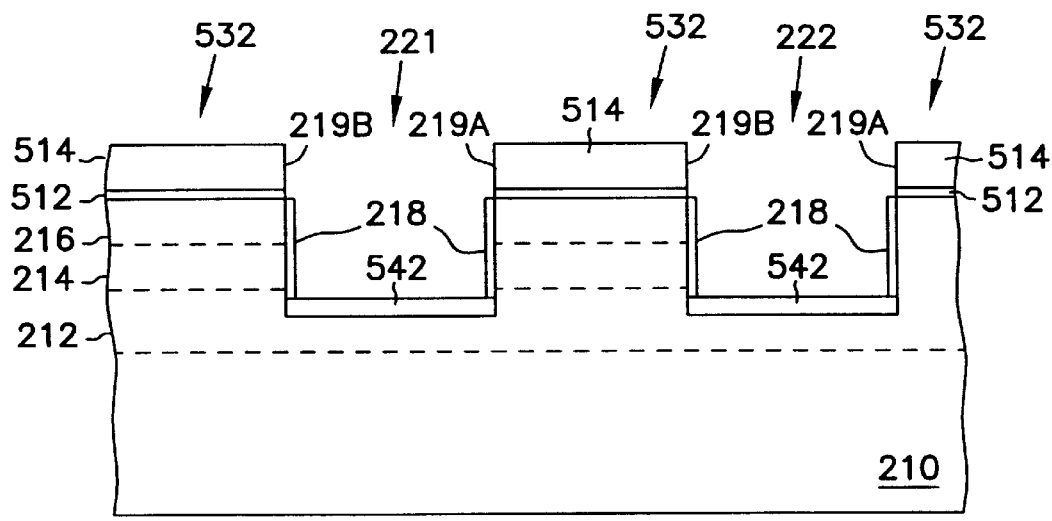

In FIG. 1H, a gate oxide 218 is formed on the first and second opposing sidewalls, 219A and 219B, in trenches 221 and 222 of second source/drain region 216, body region 214, and first source/drain region 212. In one embodiment, gate oxide 218 is a high-quality thin oxide layer that is thermally grown on the first and second opposing sidewalls, 219A and 219B, of trenches 221 and 222.

Figure 1I:
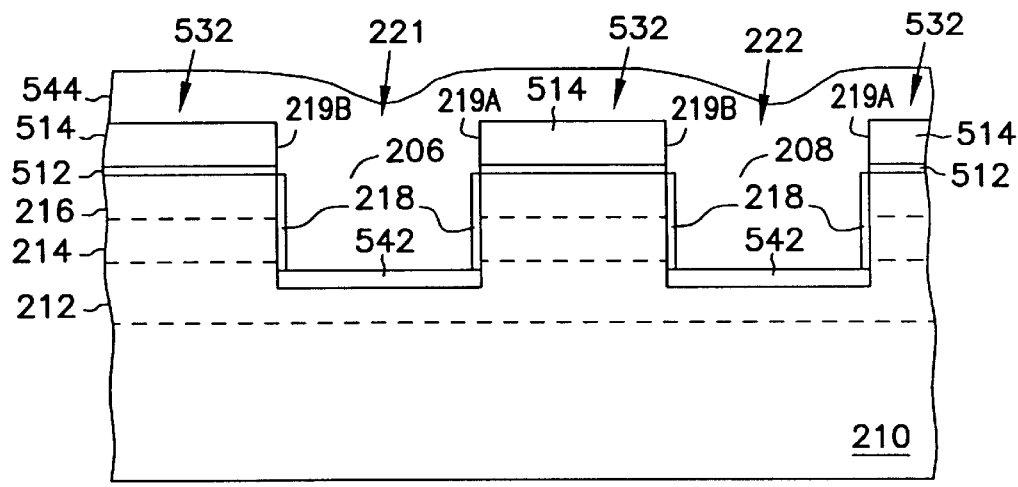

In FIG. 1I, a conductive layer 544 is formed over the working surface of the wafer, including filling trenches 221 and 222 in which respective first and second word lines 206 and 208 will be formed. The first and second word lines 206 and 208 will serve as first and second gates, 206 and 208, opposing the first and second opposing sidewalls, 219A and 219B, of trenches 221 and 222. In one embodiment, layer 544 is formed by CVD of a refractory metal, such as tungsten.

Figure 1J:
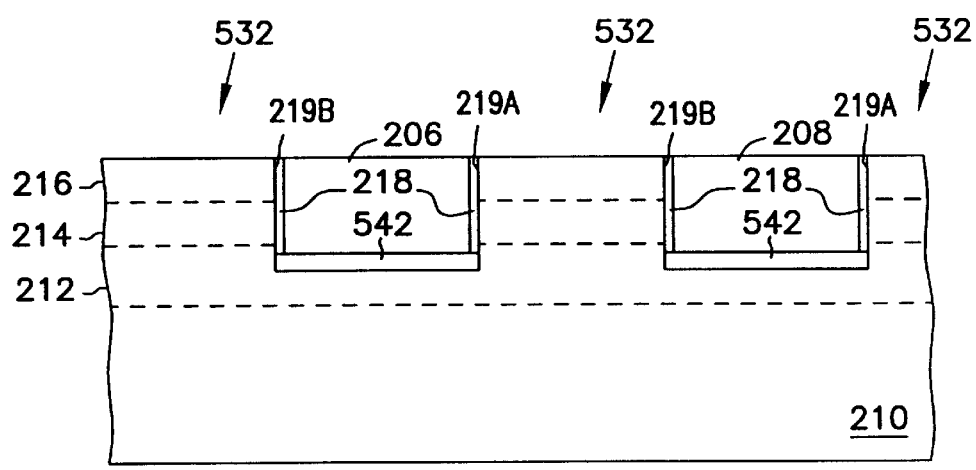

In FIGS. 1J, CMP or other suitable planarization process is used to remove portions of layer 544 above the interface between pad oxide 512 and second source/drain layer 216. Pad oxide 112 and nitride layer 514 are also removed during this planarization step. As a result of the planarization step, first and second word lines 206 and 208, which serve as first and second gates, 206 and 208, opposing the first and second opposing sidewalls, 219A and 219B, are formed in trenches 221 and 222.

Figure 1K:
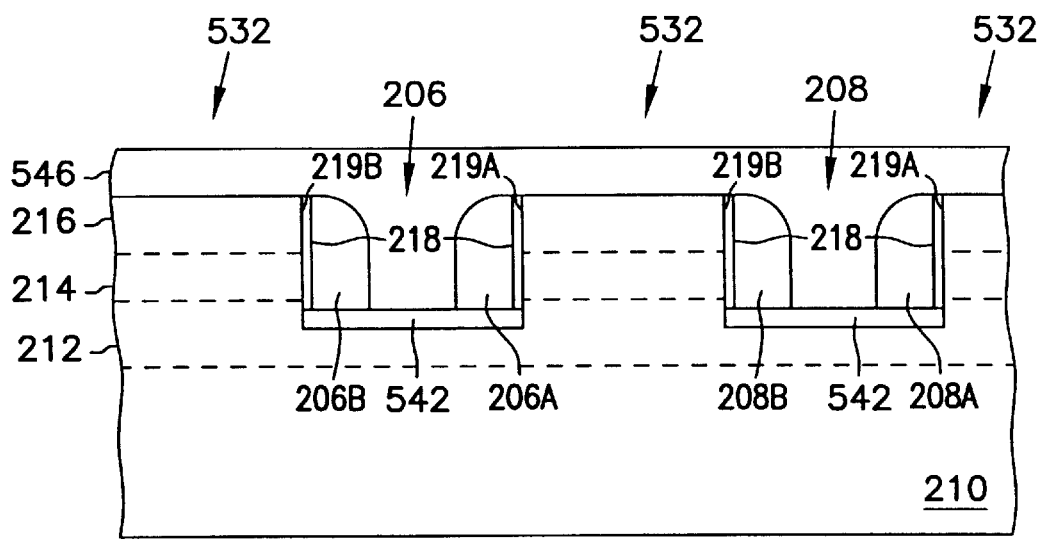

In FIG. 1K, the first and second gates, 206 and 208, opposing the first and second opposing sidewalls, 219A and 219B are directionally etched, thereby leaving resulting separate gates 206A, 206B and 208A, 208B. In one embodiment, separate gates 206A and 208B serve as a first gate 206A and second gate 208B opposing the first and second opposing sidewalls, 219A and 219B, in trenches 221 and 222. Splitting the first and second gates, 206 and 208, respectively, provides the resulting structure illustrated in FIG. 4, but is not required to practice the invention. In one embodiment, an insulating layer 546, such as $SiO_2$, is formed on the working surface of the wafer, such as by CVD. The structure thus formed may undergo further processing steps to complete integrated circuits on the working surface of the wafer using known techniques and followed by conventional back end of line (BEOL) procedures.

Figure 2A:
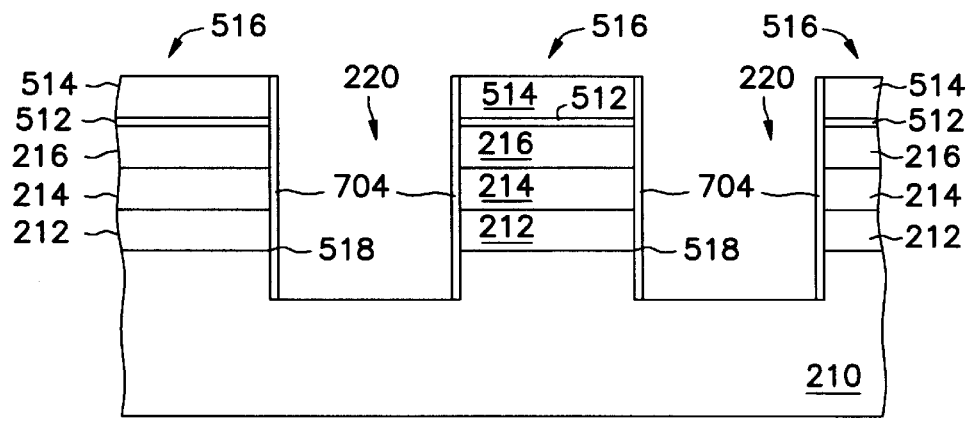
FIGS. 2A–2C illustrate an additional embodiment of the process of fabrication taught in connection with FIGS. 1A–1K.
Figure 2B:
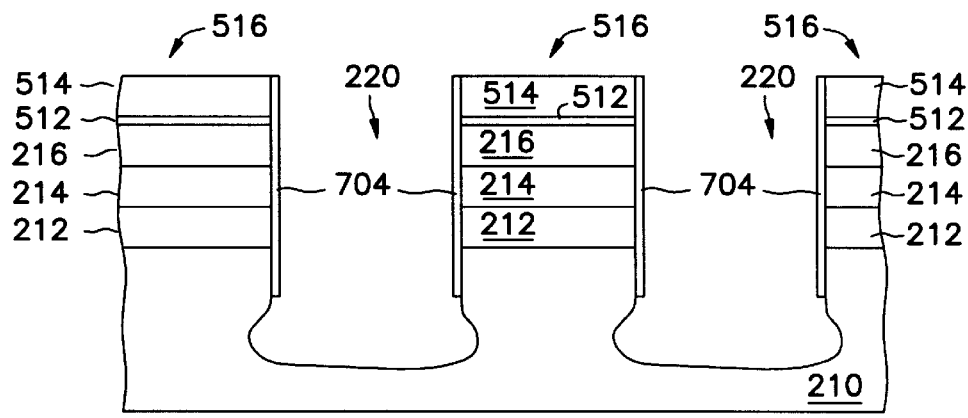
Figure 2C:
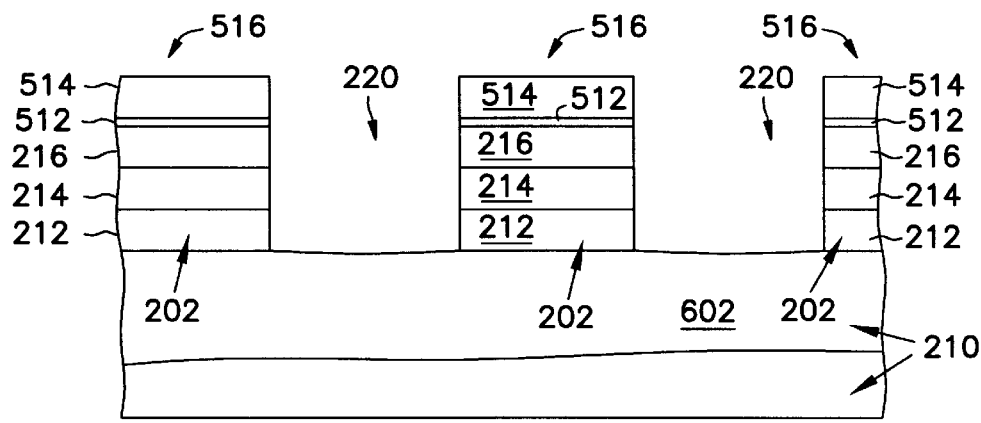

FIGS. 2A–2C illustrate generally, by way of example, additional steps used to form SOI bars during the fabrication steps described above with respect to FIGS. 1A–1K, such that the MOSFET formed, extends vertically outward from an insulating portion 602 of substrate 210.

In FIG. 2A, the processing steps described above with respect to FIGS. 1A–1C are carried out, forming trenches 220 that are etched to a depth that is below the original surface 518 of substrate 210, such as by approximately greater than or equal to 0.6 µm. A nitride layer 704 is formed, such as by CVD. Nitride layer 704 is directionally etched, such as by RIE, to remove nitride layer 704 from the base regions of trenches 220. Portions of nitride layer 704 remain on the sidewall of trenches 220 to protect adjacent layers during subsequent etching and oxidation.

In FIG. 2B, an isotropic chemical etch of silicon is used to partially undercut bars 516. For example, hydrofluoric acid (HF) or a commercial etchant sold under the trade name CP4 (a mixture of approximately 1 part (46% HF):1 part ($CH_3COOH$):3 parts ($HNO_3$)) can be used for the isotropic etchant. In one embodiment, the partial undercutting of bars 516 by isotropic etching is timed to remove a volume of silicon that is sufficient to compensate for a subsequently formed volume of oxide, described below. In general, the subsequent oxidation step produces a volume of oxide that is approximately twice that of the silicon consumed during oxidation.

In FIG. 2C, substrate 210 is oxidized using a standard semiconductor processing furnace at a temperature of approximately 900 to 1,100 degrees Celsius. A wet oxidizing ambient is used in the furnace chamber to oxidize the exposed silicon regions in the lower portion of trenches 220. Substrate 210 is oxidized for a time period that is sufficient to form oxide insulation portion 602 that fully undercuts bars 516. Insulating portion 602 underlies both bars 516 and trenches 220, and isolates the bit lines 202 and MOSFETs formed on bit lines 202 from an underlying semiconductor portion of substrate 210. Nitride layer 704 is removed, and processing then continues as described above with respect to FIGS. 2D–2K.

In one embodiment, bars 516 are sufficiently narrow such that the oxidation step that undercuts bars 516 produces sufficient oxide to fill trenches 220, resulting in a generally planar structure. This avoids the need for a separate step of depositing an oxide insulation material 224 described with respect to FIG. 1D. The oxidation time period depends on the width of bars 516 and the effective width of bars 516 after the undercut etch step. Narrower bars 516 require shorter oxidation times. For example, for sub-0.25 micron technology, oxidation time is approximately 1 hour. In another embodiment, the etch step fully undercuts bars 516 before oxidation. This further reduces oxidation time.

Figure 3A:
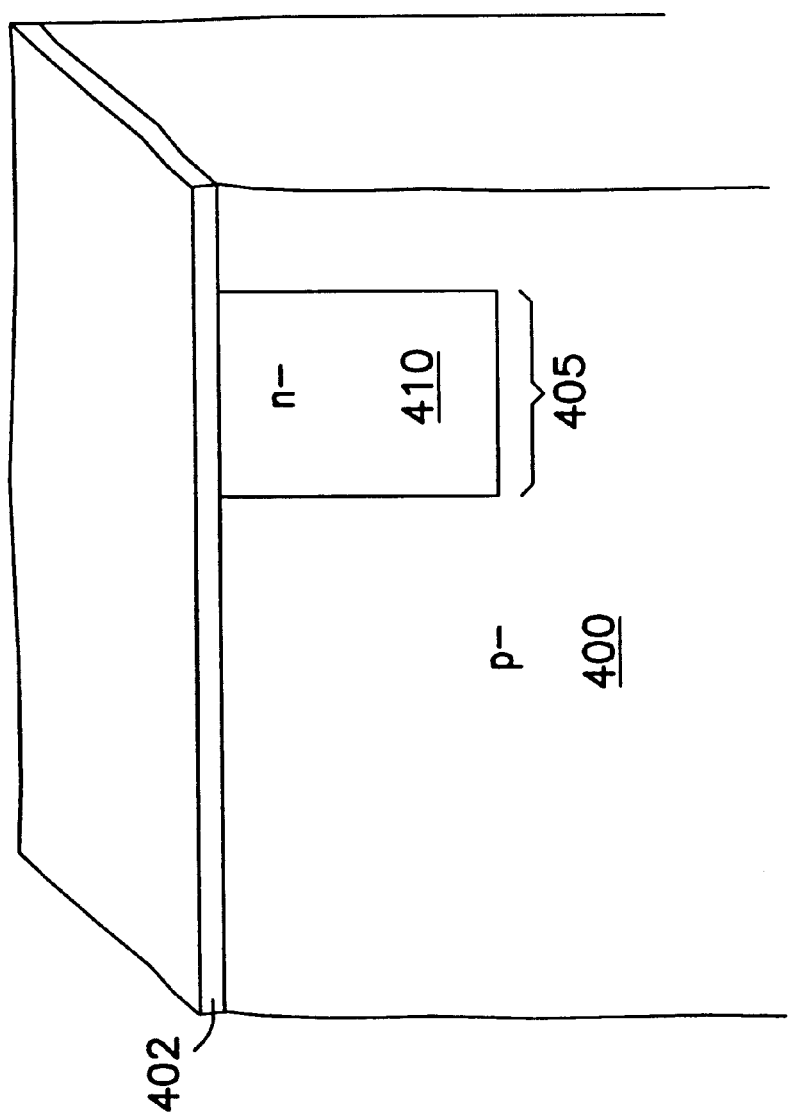
FIGS.3A–3O illustrate an embodiment of a process of fabrication of a complementary pair of transistors according to the teachings of the present invention.

FIGS. 3A–3O illustrate an embodiment of a process of fabrication of a complementary pair of transistors according to the teaching of the present invention. FIG. 3A begins with a lightly doped p- silicon substrate 400. A thin screen oxide layer 402 is thermally grown. The oxide layer 402 is formed to a thickness of approximately 10 nanometers (nm). A photoresist is applied and selectively exposed to reveal p-channel metal-oxide semiconductor (PMOS) device regions 405. Wells of n-type silicon material are formed in the substrate 400 to form the PMOS device regions 405. The n-well 410 of n-type material can be formed by any suitable method, such as by ion implantation. The n-wells 410 are formed to a depth of approximately 1.0 micrometer (µm). The photoresist is removed using conventional photoresist stripping techniques. The structure is then annealed, such as by a rapid thermal anneal (RTA) process, to achieve the desired doping profile. The structure is now as it appears in FIG. 3A.

Figure 3B:
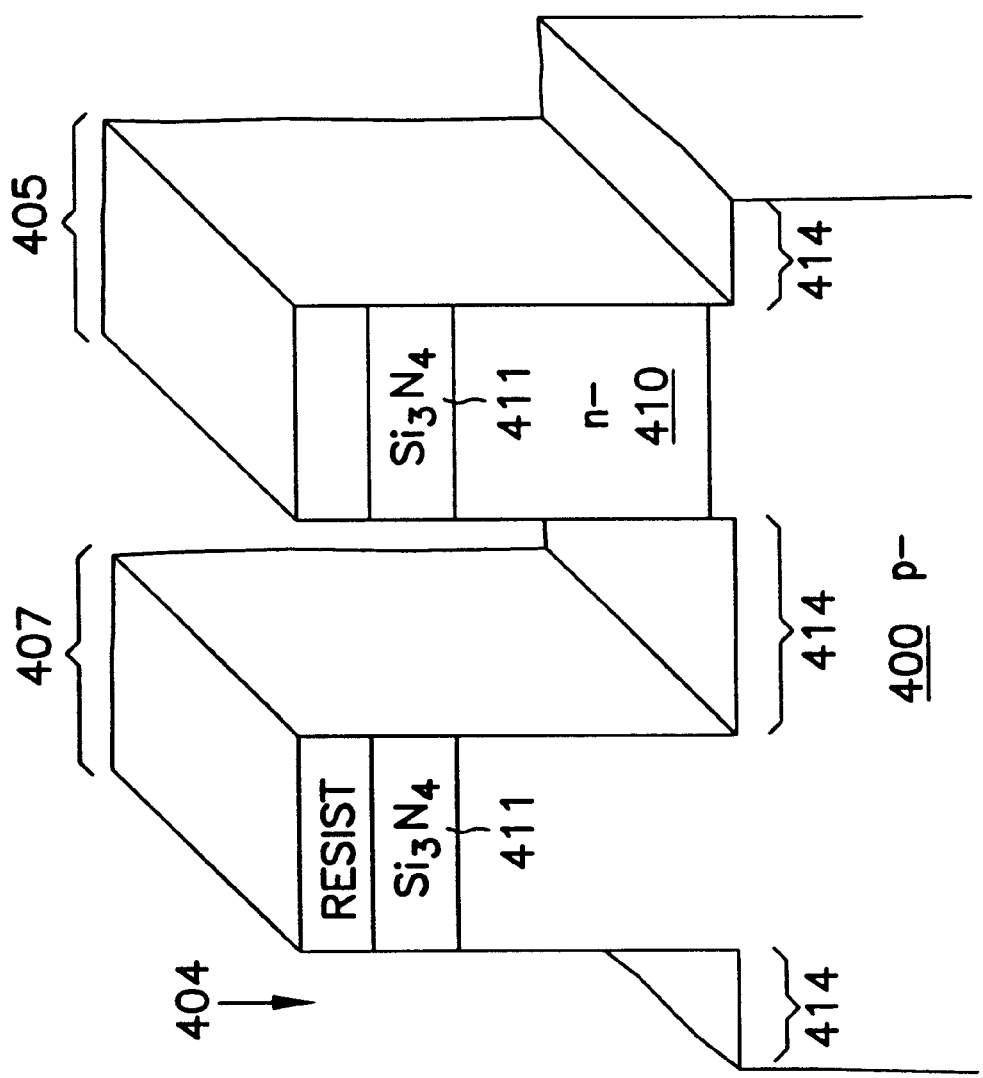

FIG. 3B illustrates the structure after the next sequence of processing steps. A silicon nitride ($Si_3N_4$)pad layer 411 is deposited on the upper surface 404 of the substrate 400 and the n-wells 410. The nitride layer 411 is formed by any suitable means, such as by chemical vapor deposition (CVD). The nitride layer 411 is formed to a thickness of approximately 0.4 82 m. A photoresist is applied and selectively exposed to mask stripes which define active device regions, including both n-channel metal-oxide semiconductor (NMOS) device regions 407 and PMOS device regions 405. In an exemplary embodiment, the active device regions, including both n-channel metal-oxide semiconductor (NMOS) device regions 407 and PMOS device regions 405 are defined to have a width which is sufficiently thin, vis-a-vis the doping concentration of the body region 214, such that the bulk charge in the active device regions is extremely small, negligible in device operation. This is to facilitate that the active device regions, including both n-channel metal-oxide semiconductor (NMOS) device regions 407 and PMOS device regions 405 can be fully depleted when a gate potential is applied. The nitride layer 411 in between device regions, 405 and 407, is removed. The nitride layer 411 is removed by any suitable etching technique, such a by RIE. The exposed n-well material 410 and p-substrate material 400 is etched to a depth of approximately 0.2 µm below the bottom of the n-well 410/substrate 400 interface. These etching steps leave trenches 414 between the device regions 407 and 405. The etching is performed though any suitable process, such as by RIE. The structure is now as shown in FIG. 3B. The photoresist is next stripped, using conventional photoresist stripping techniques.

Figure 3C:
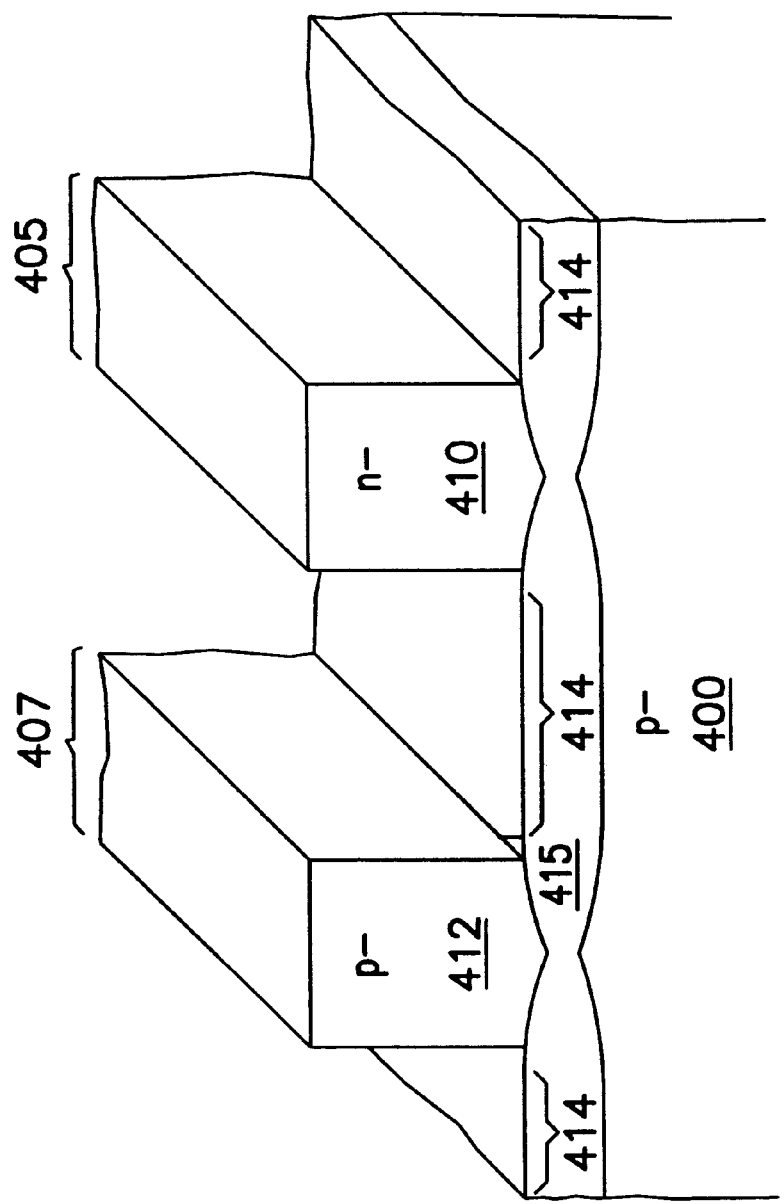

FIGS. 3C illustrates the structure after the next series of processing steps. An insulator layer 415 is formed beneath the device regions, 405 and 407 respectively, so as to form a semiconductor on insulator (SOI) structure. The insulator layer 415 is formed using, for example, the techniques of U.S. application Ser. NO. 08/745,708, entitled *Silicon-On-Insulator Islands and Method for Their Formation* (the '708 Application), or U.S. Pat. No. 5,691,230, entitled *Technique for Producing Small Islands of Silicon on Insulator* (the '230 Patent). The '708 Application and the '230 Patent are incorporated by reference. The insulator layer 415 separates from substrate 400 the p- single crystalline silicon structure 412 of the NMOS device region 407, and the single crystalline silicon structure n-well 410 of the PMOS device region 405. Any of the nitride layer 411 left on the device regions, 405 and 407, is removed by etching. Any suitable etching techniques may be used. In one embodiment, the nitride layer is removed by reactive ion etching (RIE). In all alternative embodiment, the nitride layer is removed using a wet etch process. The structure is now as illustrated in FIG. 3C.

Figure 3D:
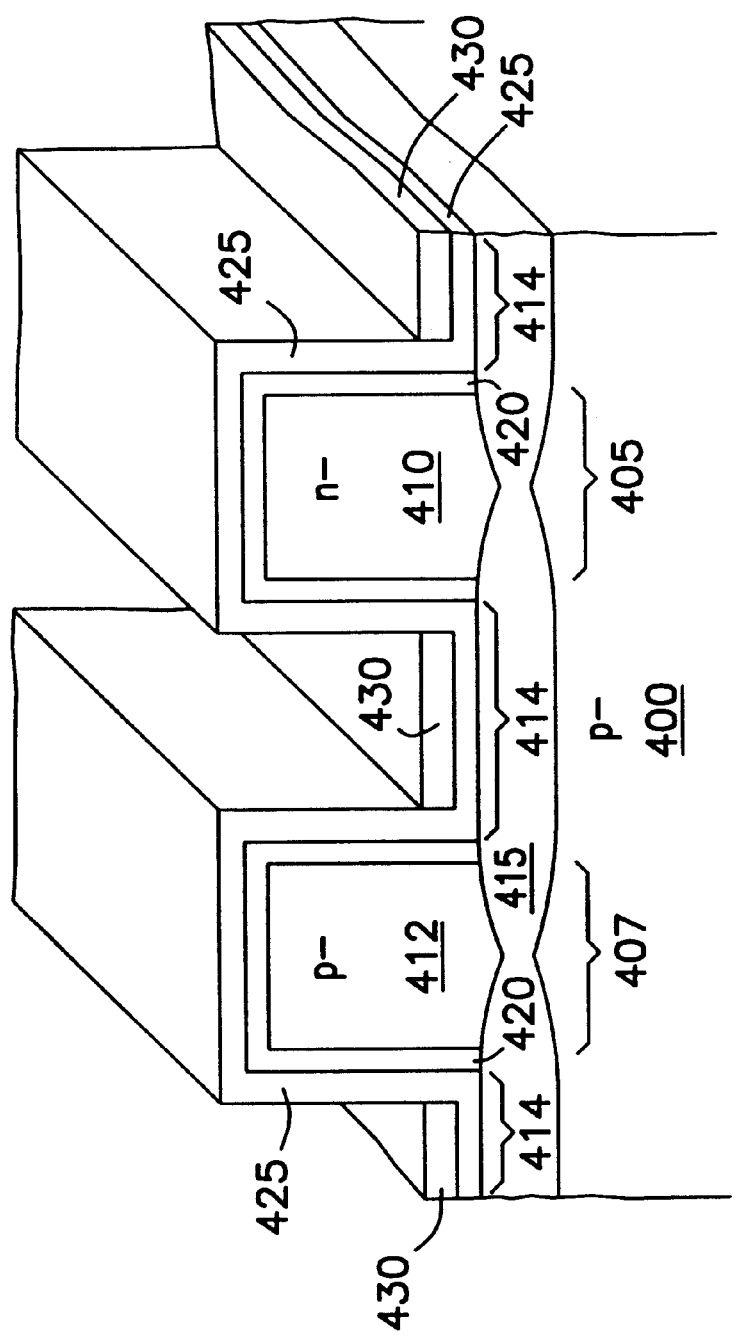

FIG. 3D illustrates the structure following the next series of processing steps. A thin oxide layer 420 is thermally grown on active device regions, 405 and 407. The oxide layer 420 is grown to a thickness of approximately 20 nanometers (nm). A think silicon nitride ($Si_3N_4$) layer 425 is deposited over the entire surface by CVD. The nitride layer 425 is deposited to a thickness of approximately 50 nm. Intrinsic polysilicon 430 is deposited by any suitable methods, such as by CVD, to fill the trenches 414. Next, the intrinsic polysilicon 430 over the structure is planarized stopping on the nitride pads 425. The intrinsic polysilicon 430 can be planarized by any suitable process, such as by chemical mechanical polishing/planarization (CMP). The intrinsic polysilicon 430 in the trenches 414 is selectively etched back further, such as by RIE, to leave only a thin layer on the bottom of trenches 414. The structures now as is shown in FIG. 3D.

Figure 3E:
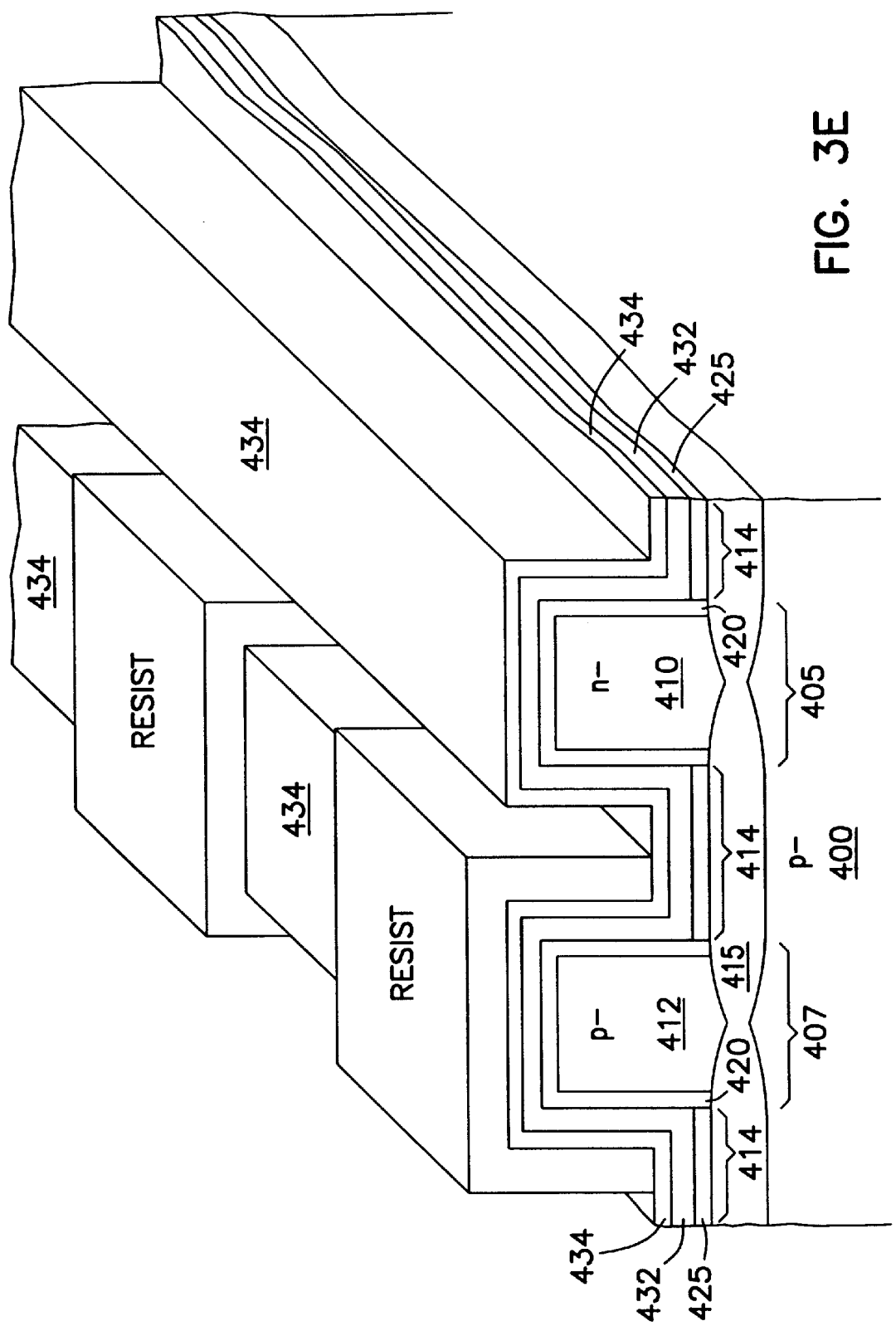

FIG. 3E shows the structure following the next sequence of processing steps. Every exposed portion of the nitride layer 425 is removed by a selective wet etch or RIE, leaving only the nitride 425 covered by the intrinsic polysilicon 430 at the bottom of the trenches 414. The intrinsic polysilicon 430 is then removed by a selective wet etch or RIE. The device regions, 405 and 407 respectively, remain protected by the oxide layer 420. Next, n-doped glass 432 is deposited, such a by CVD. In one embodiment the n -doped glass 432 is Phosphorus silicate glass (PSG). The n-doped glass 432 is deposited to a thickness of approximately 100 nm. A new silicon nitride ($Si_3N_4$) layer 434 is deposited over the n-doped glass 432. The new nitride layer 434 is CVD deposited to a thickness of approximately 20 nm. A photoresist is applied and selectively exposed to reveal PMOS device regions 405 and to pattern the n-doped glass 432 in the NMOS device regions 407 in the form of future first and second source/drain regions. The structure is now as is shown in FIG. 3E.

Figure 3F:
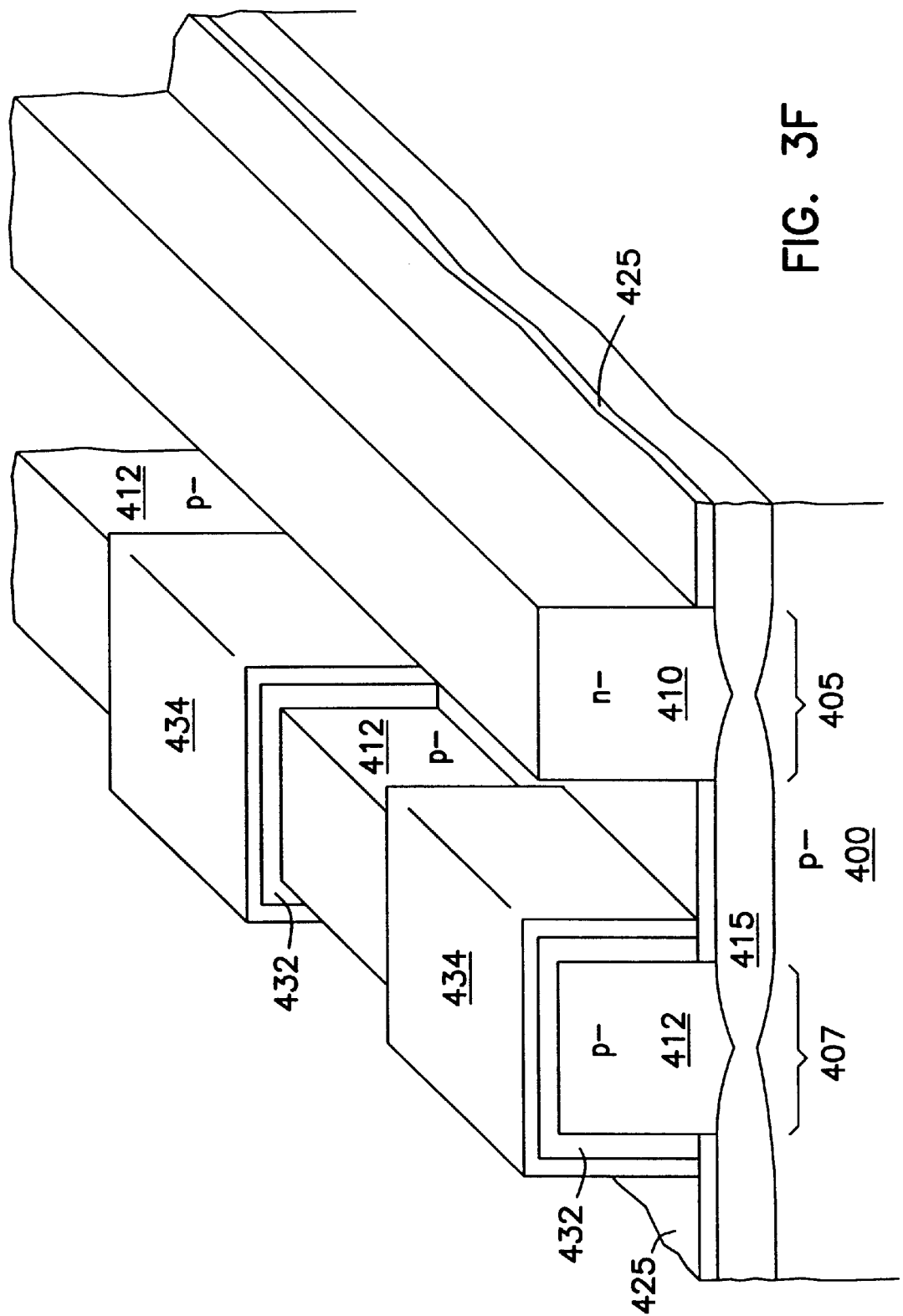

FIG. 3F illustrates the structure following the next series of process steps. The exposed nitride 434 and the underlying n-doped glass 432 are removed by any suitable means, such as by RIE. The nitride located at the bottom of the trenches 414 serves as an etch stop and protects the underlying insulator layer 415. The photoresist is stripped using conventional stripping techniques. A thin nitride layer 434 remains on the patterned n-doped glass 432 which was shielded by the photoresist. The structure is now as is shown in FIG. 3F.

Figure 3G:
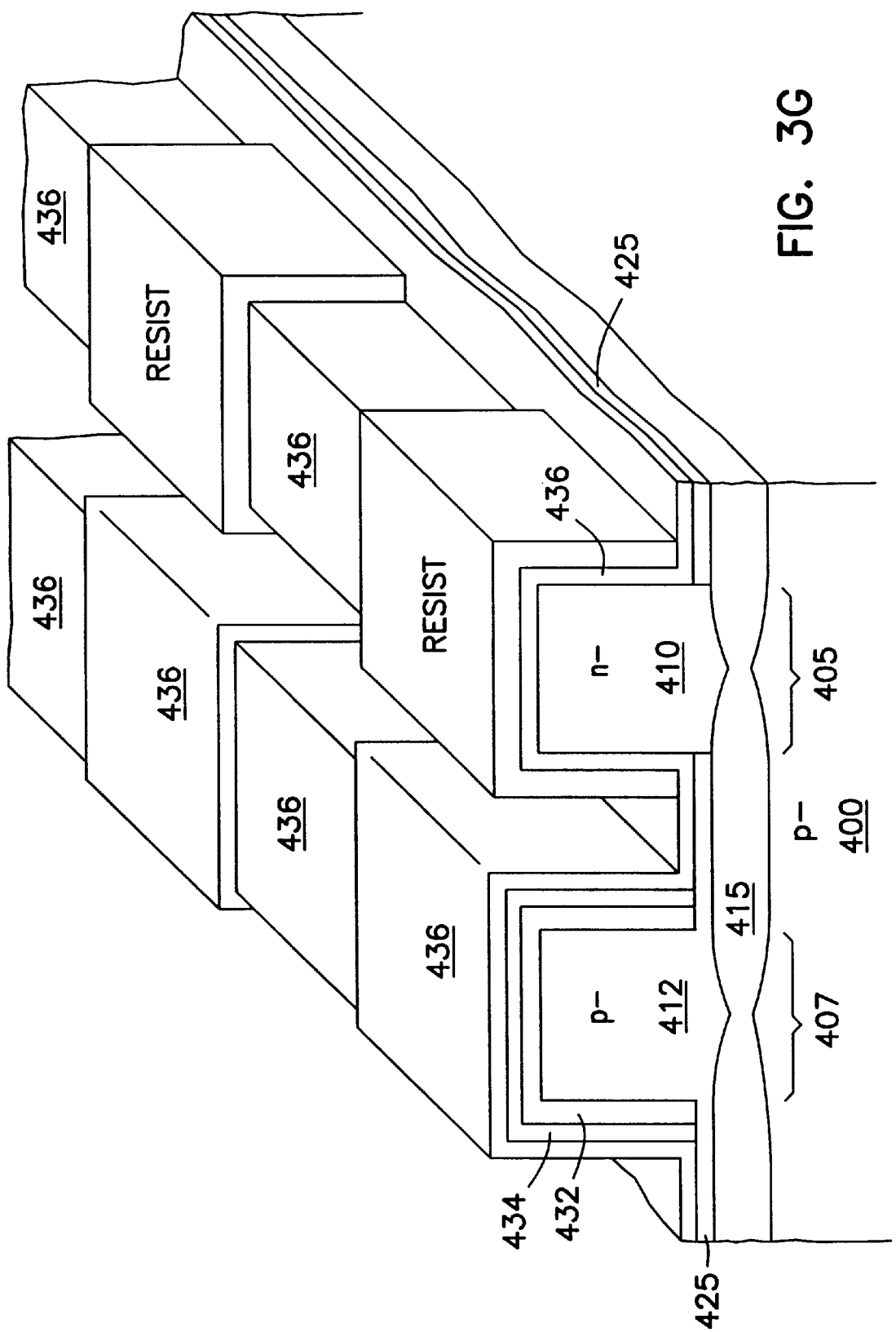

FIG. 3G illustrates the structure following the next sequence of steps. A p-doped glass 436 is deposited by any suitable means such as, for example, CVD. IN one embodiment, the p-doped glass 436 is borosilicate glass (BSG). The p-doped glass 436 is deposited to a thickness of approximately 100 nm. Again, a photoresist is applied and exposed to now reveal the NOMS device regions 407 and to pattern the p-doped glass 436 in the PMOS device regions 405 in the form of future first and second source/drain regions. The structure is now as is shown in FIGS. 3G.

Figure 3H:
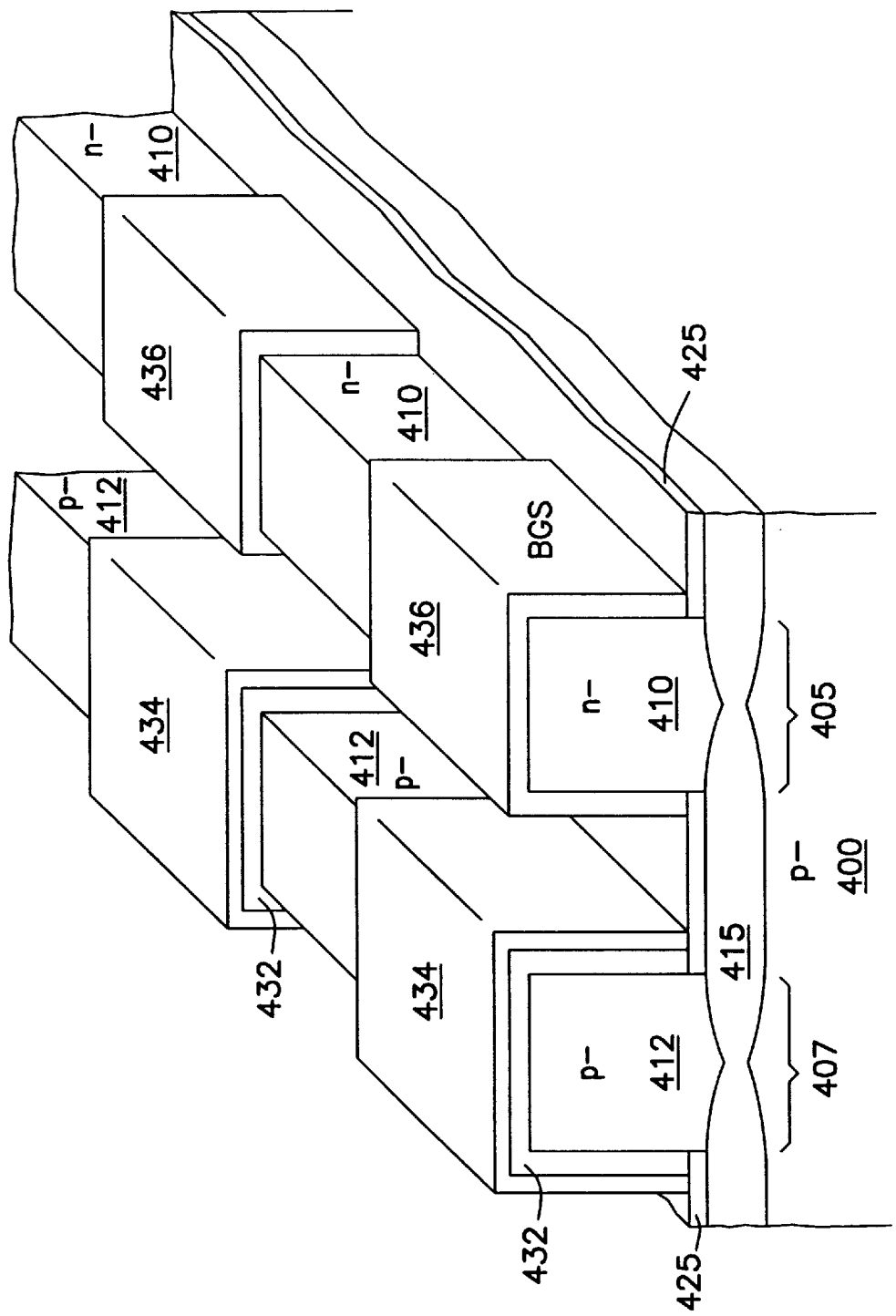
Figure 31:
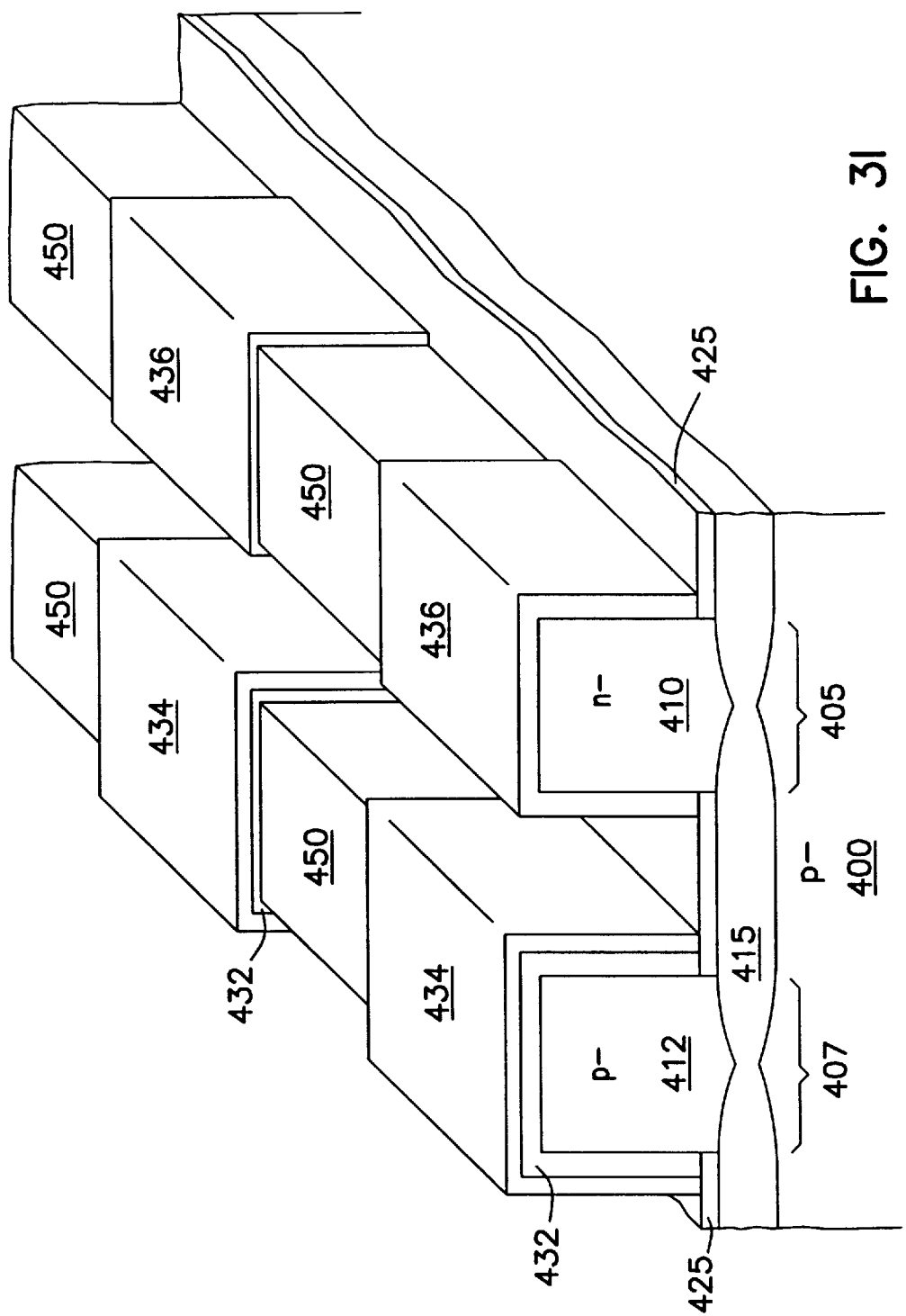

FIG. 3H illustrates the structure following the next series of process steps. The exposed p-doped glass 436 is removed by any suitable means, such as by RIE. The nitride located at the bottom of the trenches 414 again serves as an etch stop and protects the underlying insulator layer 415. Also, the thin nitride layer 434 remaining on patterned n-doped glass 432 portions serves as an etch stop and protects the regions of patterned n-doped glass 432. The photoresist is stripped using conventional stripping techniques. The structure is now as shown in FIG. 3H.

FIG. 3I provides a perspective view of the structure after the next process step. In this step a gate oxide 450 is thermally grown on the p- single crystalline silicon structure 412 of the NMOS device region 407, and on the n-well single crystalline silicon structure 410 of the PMOS device region 405.

Figure 3J:
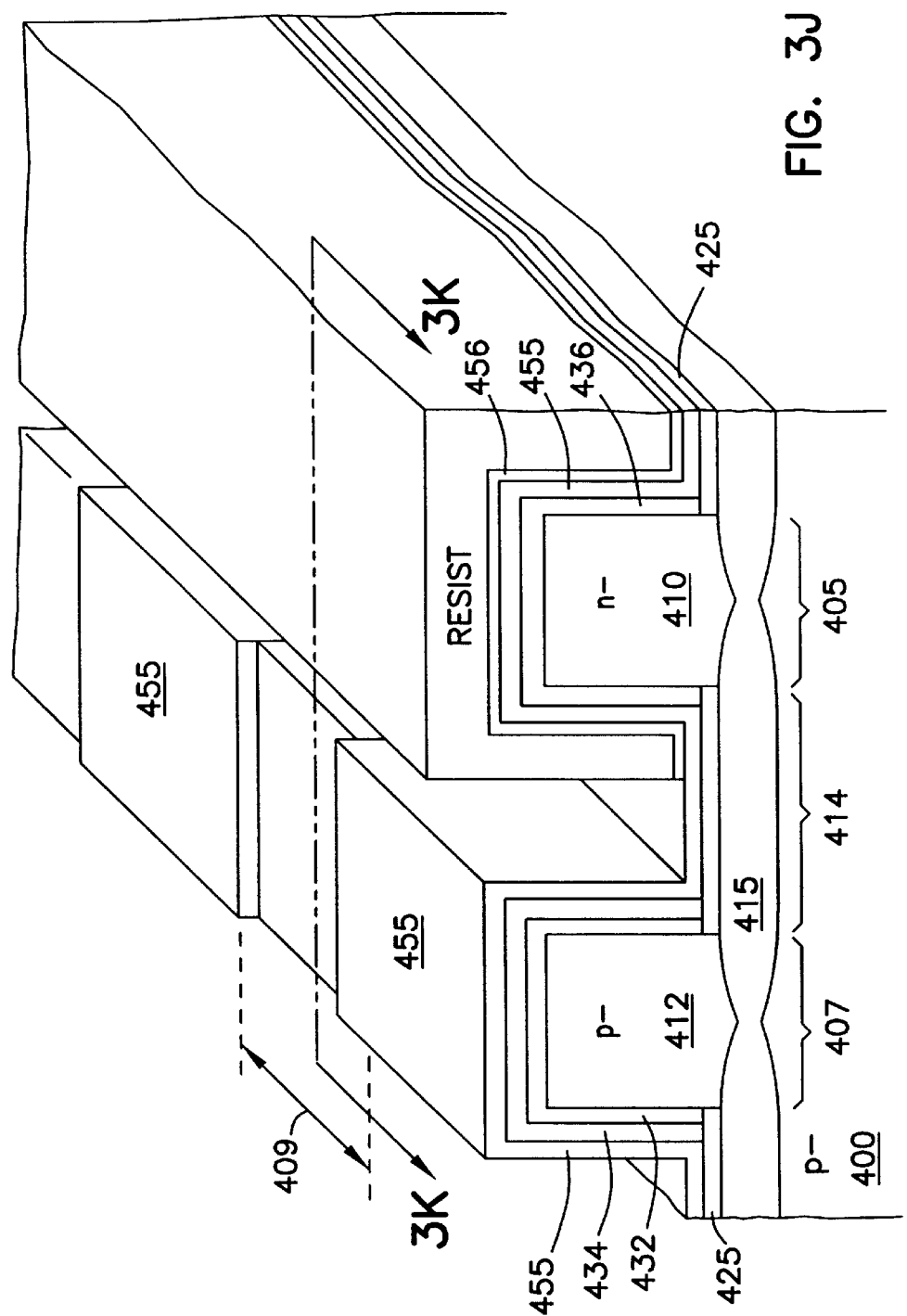

FIG. 3J carries the sequence of process steps further. In FIG. 3J, a thin intrinsic polysilicon layer 455 is deposited. Such as by CVD. The intrinsic polysilicon layer 455 is formed to a thickness of approximately 50 nm. Next, a thin oxide layer 456 is deposited across the nitride layer 455. The oxide layer 456 can be deposited by any suitable method, such as by CVD. The oxide layer is deposited to a thickness of approximately 10 nm. A photoresist is applied and masked to expose the NMOS device region 407. The exposed oxide layer 456 is etched back. The etching is performed by any suitable method and can be accomplished using reactive ion etching (RIE). The structure is now as appears in FIG. 3J.

Figure 3K:
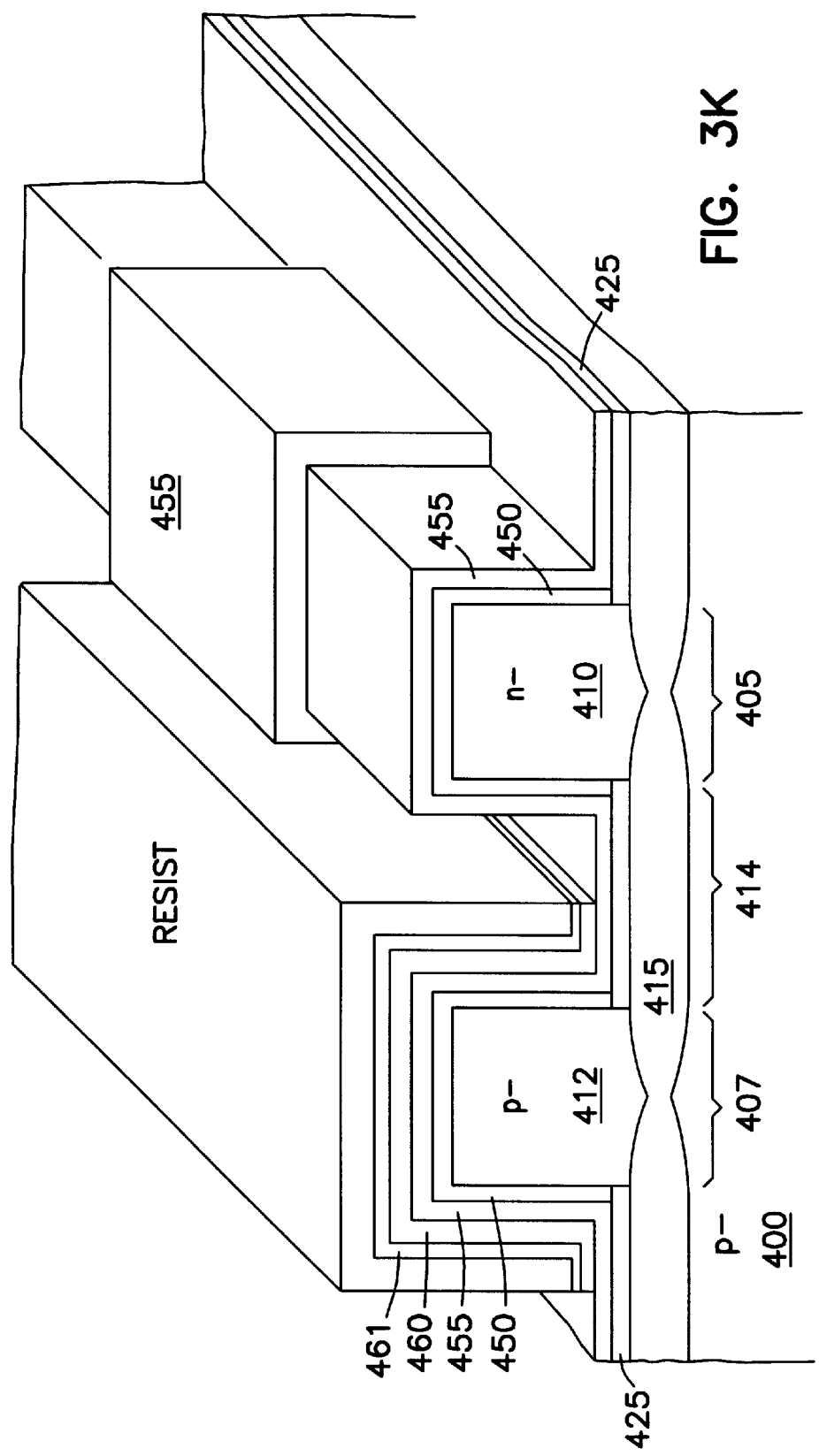

FIGS. 3K illustrates the structure following the next sequence of process steps. FIG. 3K is a cross-sectional view of the gate region 409 taken along cut line 3K–3K. The photoresist has been stripped using conventional photoresist stripping techniques. Now, an n+ polysilicon layer 460 is deposited across the entire surface. The n+ polysilicon layer is deposited by any suitable means, such as by CVD. The nitride layer is deposited to a thickness of approximately 20 nm. A photoresist is applied and selectively exposed to reveal the PMOS device regions 405. The exposed nitride layer 461 and n+ polysilicon layer 460 underneath are etched off, such as by RIE. The exposed oxide layer 456 is next etched away by RIE. The structure is now as appears in FIG. 3K.

Figure 3L:
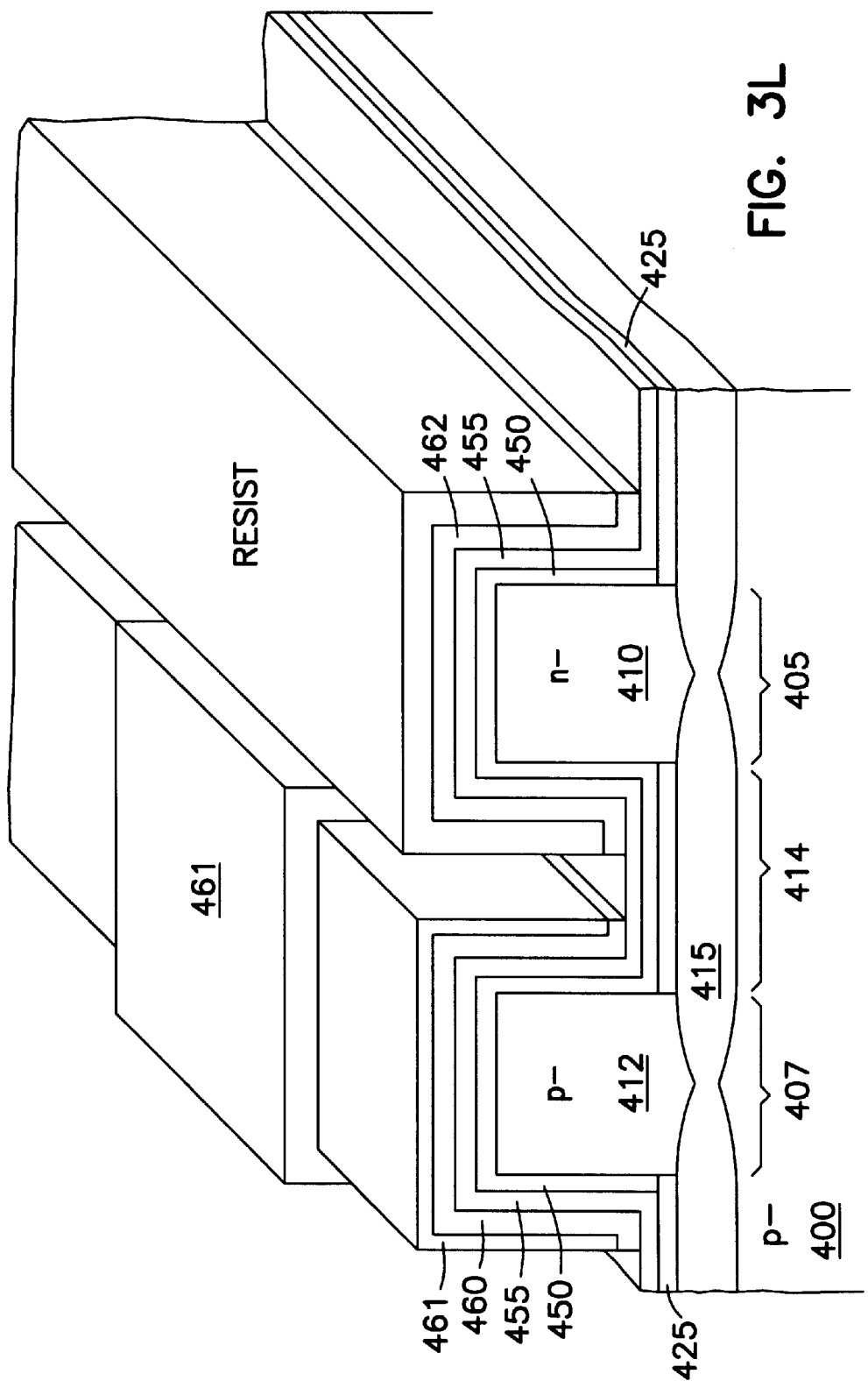

FIGS. 3L illustrates the structure following the next sequence of process steps. The photoresist has been stripped using conventional photoresist stripping techniques. Now, a p+ polysilicon layer 462 is deposited across the entire surface. The p+ polysilicon layer is deposited by any suitable means, such as by CVD. A photoresist is applied and selectively exposed to reveal the NMOS device region 407. The exposed p+ polysilicon layer 462 is etched off, such as by RIE. The structure is now as appears in FIGS. 3L.

Figure 3M:
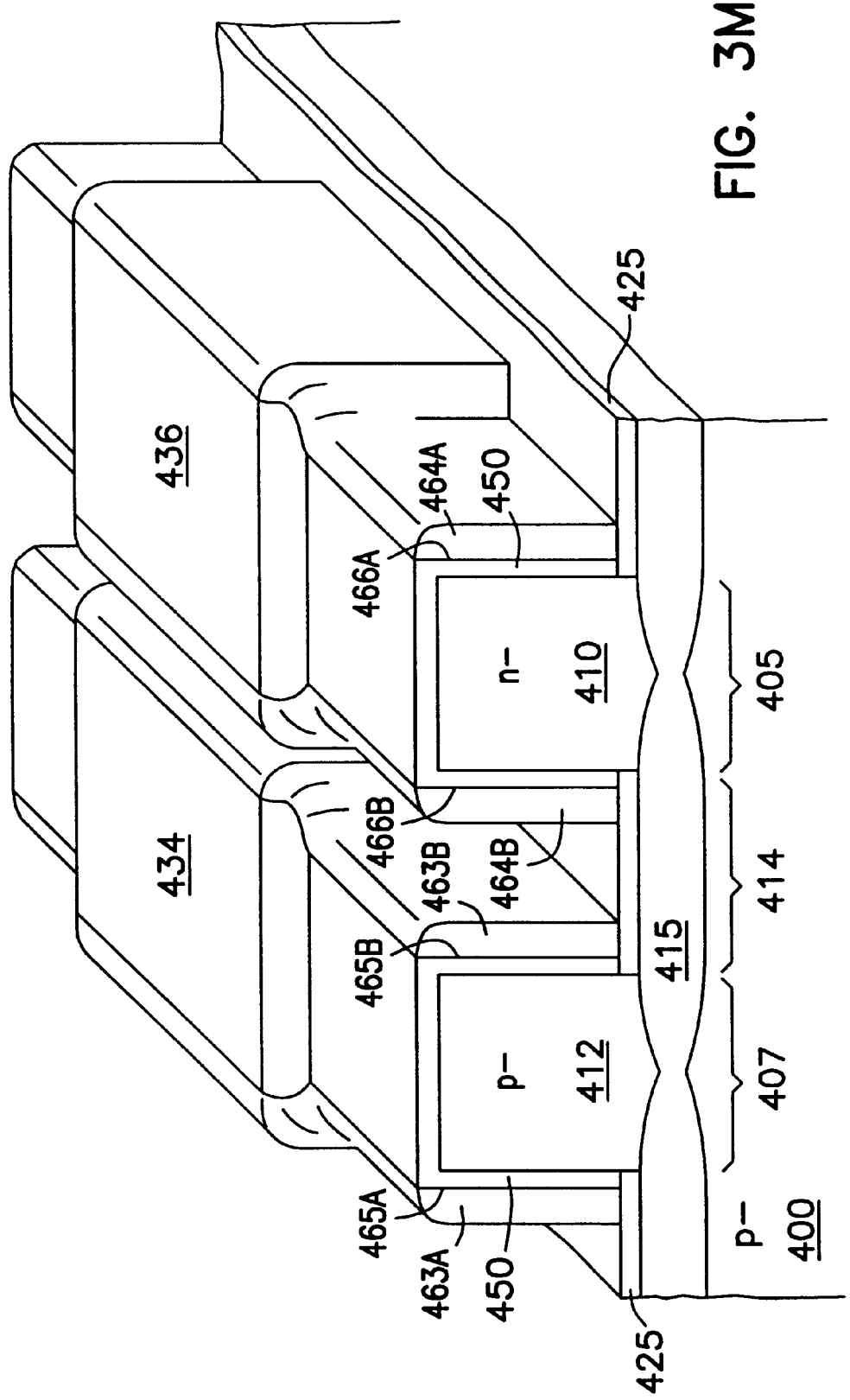

FIG. 3M illustrates the structure after the next group of process steps. The photoresist is stripped using conventional photoresist stripping techniques. The structure undergoes an anneal, such as a rapid thermal anneal (RTA), in order to drive the dopant species from the heavily doped n+ and p+ polysilicon layer, 460 and 462 respectively, into the underlying, undoped polysilicon 455. This step forms a heavily doped n+ gate layer 463 in the NMOS device region 407, and forms a heavily doped p+ silicon gate layer 464 in the PMOS device region 405. The anneal also serves to drive the dopant into the n-well single crystalline silicon structure 410 and the p- single crystalline silicon structure 412 from the p-doped glass 436 and the n-doped glass 432 respectively. The n+ and p+ polysilicon gate layers, 463 and 464 respectively, are directionally etched to leave only on the vertical side walls of the NMOS and PMOS device regions, 407 and 405. This step forms heavily doped first and second n+ gates, 463A and 463B, in the NMOS device region 407, opposite opposing sidewalls surfaces, 465A and 465B respectively. Likewise, the directional etch forms heavily doped p+ silicon gates, 464A and 464B, in the PMOS device region 405, opposite opposing sidewall surfaces, 466A and 466B respectively. The structure is then as appears in FIG. 3M.

Figure 3N:
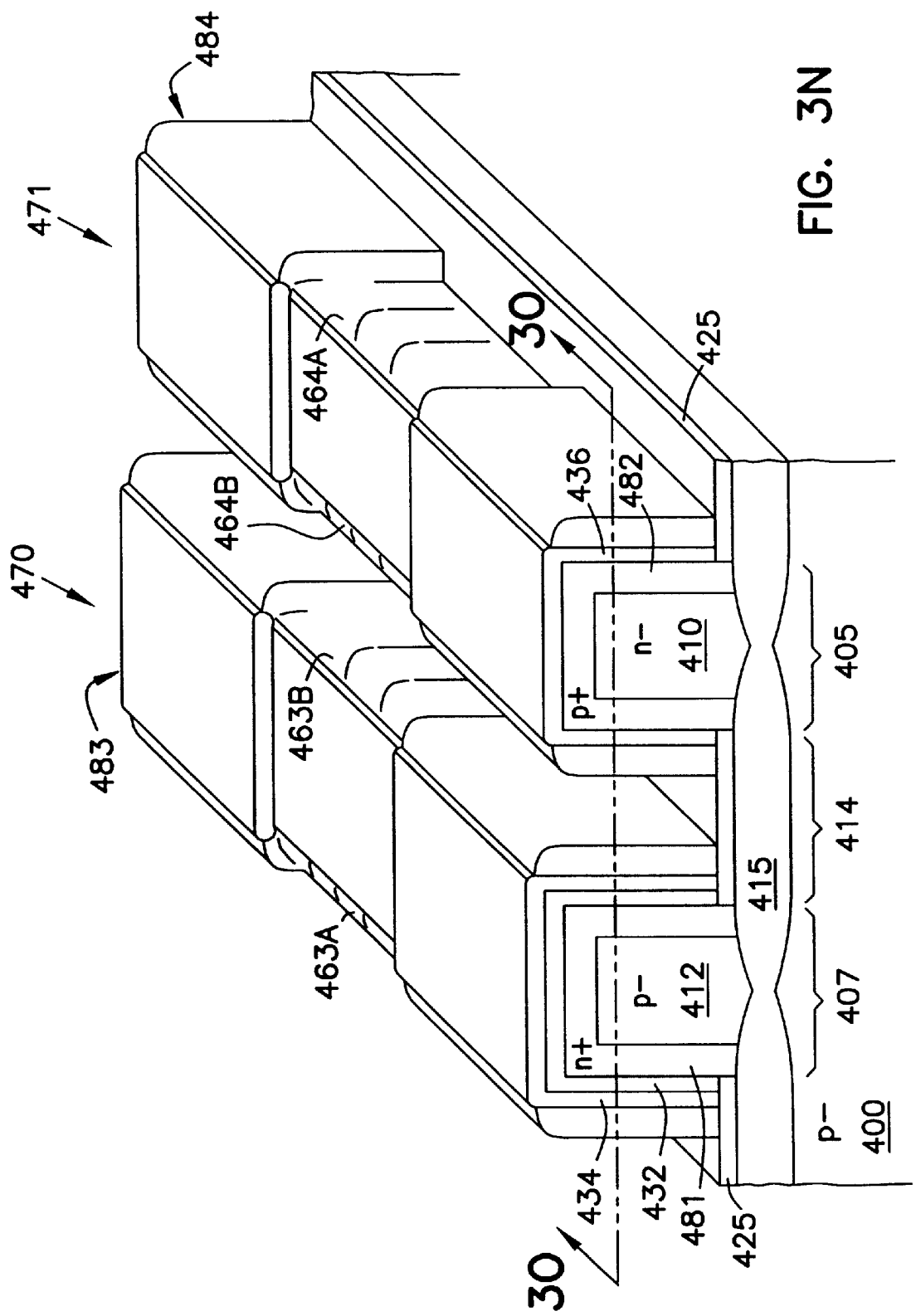
Figure 30:
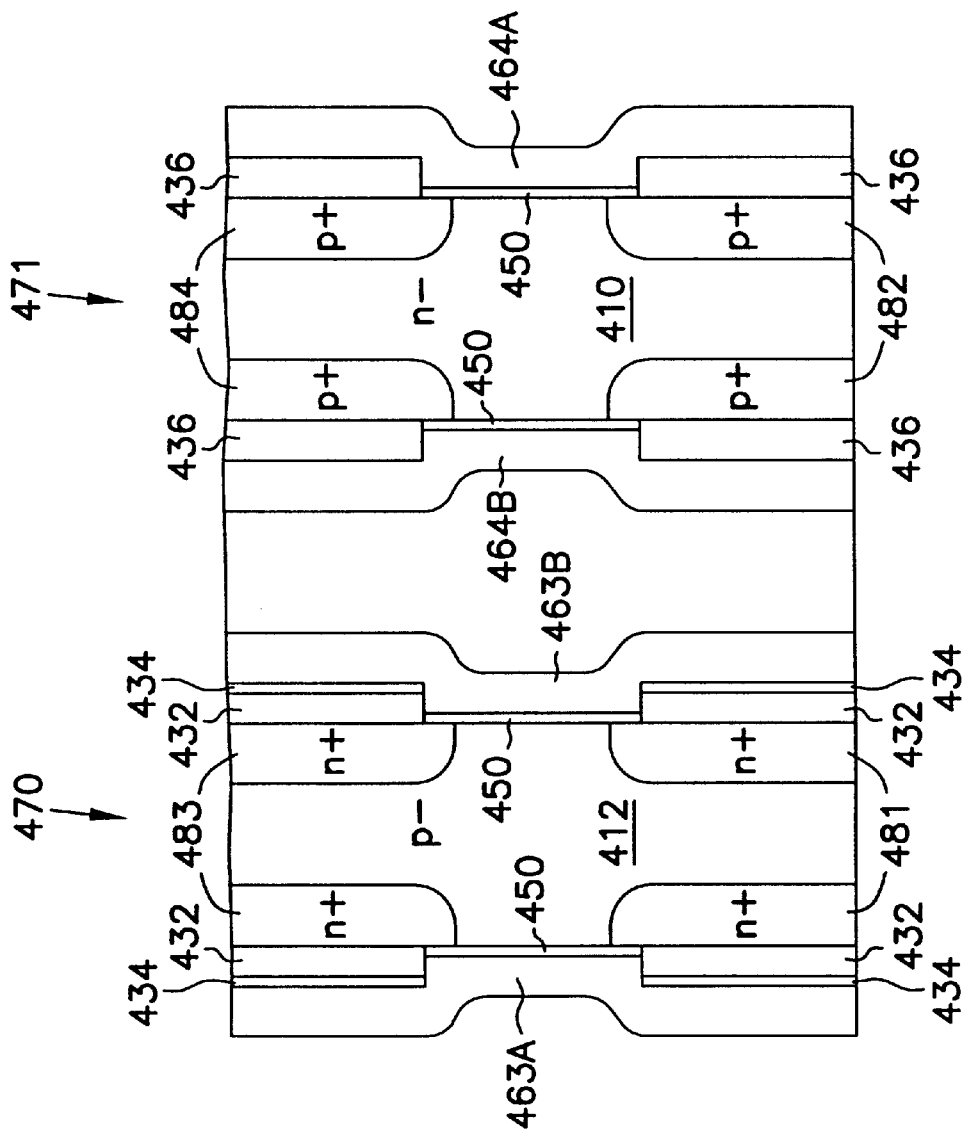

FIG. 3N provides a broader perspective view following the preceding series of process steps. FIG. 3N illustrates full length NMOS and PMOS devices, 470 and 471 respectively. FIGS. 3N illustrates the location of the newly formed first source/drain regions, 481 and 482, as well as the second source/drain regions, 483 and 484, for the NOMS and PMOS devices, 470 and 471. FIG. 3O is a top view of FIG. 3N taken along cut line 3N—3N.

Finally, in a final sequence of processing steps, and following conventional method, a photoresist is applied and masked to expose any vertical walls where polysilicon 463 and 464 is to be removed to terminate gate lines. Such polysilicon 463 or 464 is then etched back by any suitable method, such as by RIE. The photoresist is stripped using conventional photoresist stripping techniques. AN oxide or other insulator is deposited and planarized to fill the trenches 414 between the NMOS and PMOS devices, 470 and 471 respectively. The insulator deposition is performed by any suitable method, such as by CVD. The planarization is also achieved by any suitable technique, such as by CMP.

Contact holes and wiring for both the gate contact and the electrical contact are formed through conventional processing steps in order to complete integrated circuit formation. One skilled in the art will recognize the method to these steps and, hence, they are not disclosed as part of this application.

Figure 4:
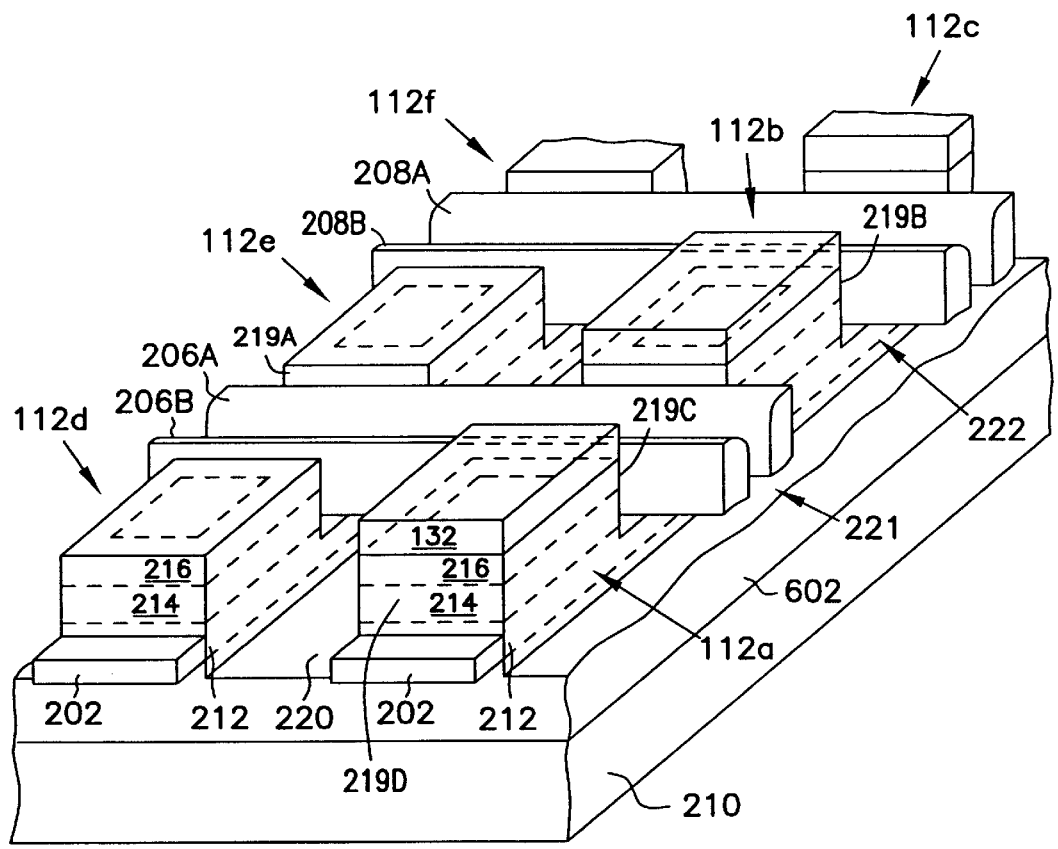
FIG. 4 is a perspective view of an embodiment of an array transistors formed according to the method of FIGS. 1A–1K and FIGS. 2A–2C.

FIG. 4 is a perspective vie of any array of transistors, 112a, 112b, 112c, 112d, 112e, and 112f, formed according to the method provided in FIGS. 1A–1K and FIGS. 2A–2C. Each MOSFET in the array of transistors, 112a, 112b, 112c, 112d, 112e, and 112f, is vertically formed on a substrate 210. In one embodiment, substrate 210 includes an insulator layer 602. Each transistor, 112a, 112b, 112c, 12d, 112e, and 112f,includes a first conductivity type, first source/drain region 212, a second conductivity type, body region 214, and a first conductivity type, second source/drain region 216. In one embodiment, the first source/drain region is formed by ion implantation of a p-type dopant into the substrate 210. Another embodiment, includes forming the first source/drain region 212 by vertically growing a p-type epitaxial layer from the substrate 210. In an alternate embodiment, the first source/drain region 212 is formed by vertically growing an n-type epitaxial layer from the substrate 210. In still another embodiment, the first source/drain region 212 is formed by first ion implanting a dopant into the substrate and then vertically growing an epitaxial layer. Each body region 214 has opposing sidewall surfaces and is vertically formed on the first source/drain region 212 by vertically growing an epitaxial layer according to the method provided FIGS. 1a–1K and FIGS. 2A–2C. Each second source/drain region 216 is formed on the vertical body region 214 in an identical manner to the first source/drain region 216. Each body region 214 is formed sufficiently thin, vis-a-vis the doping concentration, such that the body region 214 can be fully depleted when a potential is applied to the body region 214.

Focusing on transistors 112b and 112e, FIG. 4 illustrates a first gate 206A provided in trench 221. The first gate 206A opposes a first one 219A of the opposing sidewall surfaces, 219A and 219B, for the body regions 214 of transistors 112b and 112e. In FIG. 4, a second gate 208B is provided in trench 222. The second gate 208B opposes a second one 219B of the opposing sidewall surfaces, 219A and 219B, for the body regions 214 of transistors 112b and 112e. Fully depleting the body regions 214 is controlled by the synchronous bias of the first and second gates, 206A and 208B. In one embodiment, the first gate 206A and second gate 208B are independently operable and can be biased from separate sources. In an alternative embodiment the first gate 206A and the second gate 208B are biased from a single source.

Focusing on transistors 112a and 112d, a first gate 206B is provided in trench 221. The first gate 206B opposes a first one 219C of the opposing sidewall surfaces, 219C and 219D, for transistors 112a and 112d. First gates 206A and 206B are independent and electrically isolated from one another.

Figure 5:
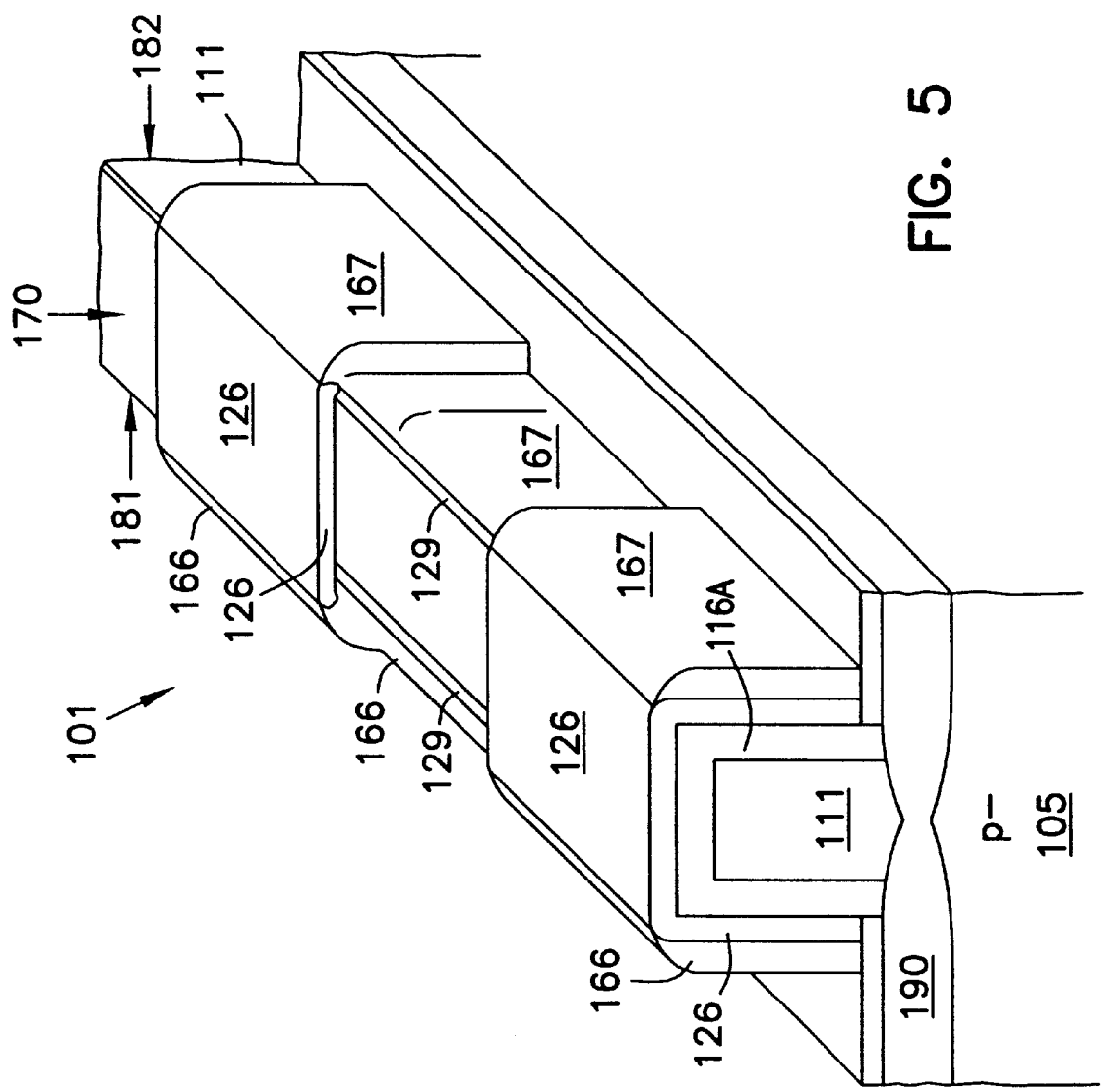
FIG. 5 is a perspective view of an embodiment of transistor formed according to the method of FIGS. 3A–3.

FIG. 5 is a perspective view of a MOSFET 101 formed according to the method provided in FIGS. 3A–3N. The MOSFET 101 represents either an n-channel MOSFET (NMOS), or a p-channel MOSFET (PMPS) depending on a selected doping profile as will be understood by one of ordinary skill in the art of semiconductor fabrication. The MOSFET 101 includes a vertically formed body region 111 that extends outwardly from a substrate 105 of p- silicon material. IN one embodiment, the body region 111 is formed on an insulator layer 190 formed on the substrate 105. The body region 111 has an upper surface 170 and opposing sidewall surfaces, 181 and 182 respectively. The body region 111 is formed sufficiently thin, vis-a-vis the doping concentration, such that the body region 111 can be fully depleted when a potential is applied to the body region 111. In the PMOS embodiment, the body region 111 is formed of a p- silicon material. In the NMOS embodiment, the body region 111 is formed of an n- silicon material.

A first source/drain region 116A is formed adjacent to the upper surface 170 and the opposing sidewall surfaces, 181 and 182, of the body region 111. Forming the first source/drain region 116A adjacent to the body region 111 includes encasing a portion of the body region 111 with a doped glass layer 126. In the NMOS embodiment, the doped glass layer 126 can be either an Arsenic silicate glass (ASG), or phosphorus silicate glass (PSG). The doped glass layer 126 is deposited by chemical vapor deposition (CVD) and then annealed to form the n-type layer of doped silicon material on the body region 111. In the PMOS embodiment, forming the first source/drain region 116A adjacent to the body region 111 includes encasing a portion of the body region 111 with a doped glass layer 126 of Borosilicate glass (BSG). The BSG is deposited by CVD and then annealed to form the p-type layer of doped silicon material on the body region 111.

Similarily, a second source/drain region 116B is formed adjacent to the upper surface 170 and the opposing sidewall surfaces, 181 and 182, of the body region 111. The second source/drain region 116B is formed in a fashion which appropriately accords to forming the first source/drain region 116A, as will be understood by one of ordinary skill in the art of semiconductor fabrication. The MOSFET 101 further includes a gate oxide layer 129 located on the opposing sidewalls, 181 and 182. A first gate 166 is formed on the gate oxide 129 on a first one 181 of the opposing sidewalls surfaces, 181 and 182, of the body region 111. A second gate 167 is formed on the gate oxide 129 on a second one 182 of the opposing sidewalls surfaces, 181 and 182, of the body region 111. The oxide layer 129 and the first and second gates, 166 and 167 respectively, are formed according to the method taught in connection with FIGS. 3A–3N.

Figure 6:
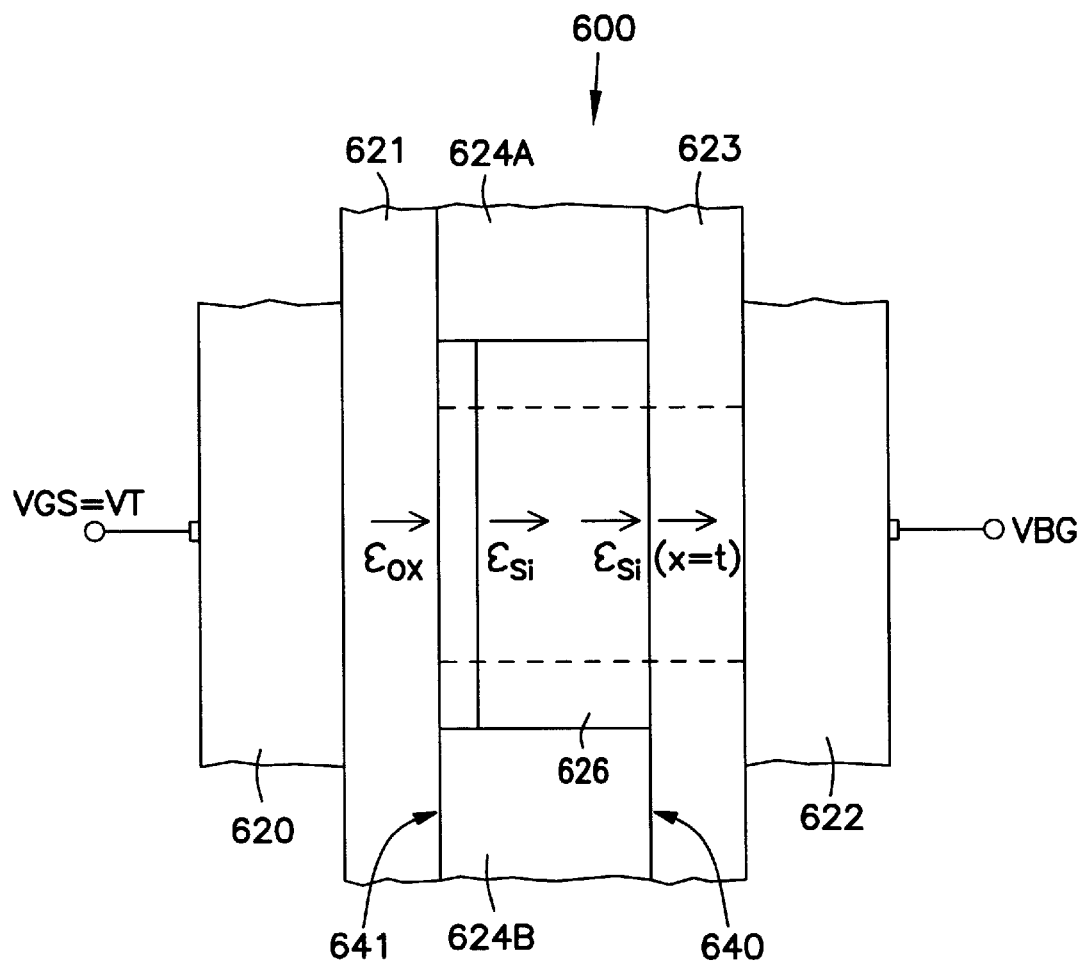
FIGS. 6 is planar view of an embodiment of a dual-gated transistor according to the teachings of the present invention.

FIG. 6 is a planar view of an embodiment of a transistor according to the teachings of the present invention. FIG. 6 illustrates a dual gates transistor 600. The dual gates transistor has a first source/drain region 624A, a body region 626, and a second source/drain region 624B. The body region 626 has opposing sidewall surfaces, 641 and 640 respectively, and the body region 626 includes a fully depleted structure. A first gate 620 is located on a first one 641 of the opposing sidewall surfaces, 641 and 640 respectively. A second gate 622 is located on a second one 640 of the opposing sidewall surfaces, 641 and 640 respectively. The threshold voltage (Vt) for the dual-gated transistor 600 is not dependent on bulk charge in the body region 626. This feature, or aspect, of the present invention is best understood by comparing the following equations and schematic representations with FIG. 6.

The threshold voltage for a conventional MOSFET is given by Equation 1, $$VT = |2\ \phi_f| + |QB/Cox| \tag{1}$$

where $QB = q\ NA\ Wd$, and is the relatively large bulk charge in the surface depletion or space charge region. For simplicity, this equation assumes an idealized structure with no oxide charge or work function difference. Note that the threshold voltage (Vt) depends directly on the magnitude of the term, QB/Cox. This term is significant and normally is of the same order of magnitude as the first term, $2\phi_f$. Fluctuations in QB will result in fluctuations of the threshold voltage (Vt). This is not the case for the fully depleted dual gated structure in FIG. 6.

The following equations outline the same type of calculation for the threshold voltage (Vt) of a fully depleted dual gated structure. In the fully depleted dual-gated structure, $$VT = |2\phi_f| + \left[|QB| + \frac{Esi \; Eox(|2\phi_f| - VBG - |QB/2Csi|)}{(Esi \; tox + Eox \; tsi)}\right] / Cox \quad (2)$$

This equation again assumes an idealized structure with no oxide charge or work function differences. Note that in Equation 2, the threshold voltage can now be controlled by the backgate bias voltage, VBG. A negative bias on the backgate will increase the front gate threshold voltage (Vt). Note also that if QB is small, the doping, NA, is low and/or the thickness, tsi, is small, then (Vt) doe not depend strong on QB. Equation 2 can also be written, $$VT = |2\phi_f| + \left[|QB| + \frac{Csi \; Cos[|2\phi_f| - VBG - |QB/2Csi|]}{(Csi + Cos)}\right] / Cox \quad (3)$$

In the limiting case as QB approaches zero then, $$VT = |2\phi_f| + \frac{Csi}{Csi + Cox}(|2\phi_f| - VBG) \quad (4)$$

This equation just represents three capacitors in series, the front gate oxide 621, the capacitance of the silicon body region 626, and the backgate oxide 623, as illustrated below;

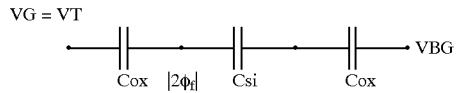

(5)

and this can be reduced to two capacitors in series;

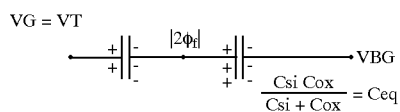

(6)

and then the charge, QBD, found on these two capacitors.

$$QBD = (|2\phi_f| - VBG)Ceq \quad (7)$$

One can then calculate the voltage drop across the front gate oxide 621, $\Delta V \times QBD/Cox$, $$\Delta V = \frac{Csi}{Csi + Cox}(|2\phi_f| - VBG) \quad (8)$$

and finally the gate voltage (Vt) at threshold for the front gate.

$$VT = VG = |2\phi_f| + \frac{Csi}{Csi + Cox}(|2\phi_f| - VBG) \quad (9)$$

In this limiting case, the threshold voltage (Vt) depends only on the thickness of the oxides, 621 and 623, and silicon body region 626 and not at all on the bulk charge. It becomes apparent in this case that the threshold voltage (Vt) can be made insensitive to fluctuations in dopant atom concentrations. The threshold voltage (Vt) is controlled by the back-gate voltage, VBG, which can be accurately set.

Conclusion

An improved method and structure are provided for MOSFETs which reduce or eliminate the effects of statistical dopant fluctuations. The structure includes a dual-gated FET which can be fabricated according to a novel processing sequence, but uses current fabrication line CMOS processing tools and process techniques. Hence the invention does not require any additional masks, forms, or an increase in the number of process steps. The dual-gated MOSFET has two gates one on each side of a thin fully depleted silicon structure, or body region. The small volume, or thin width, of the body of the dual-gated transistor allows the device to be fully depleted in MOSFET operation. In effect, the bulk charge in the body region is extremely small, negligible in device operation, and therefore the threshold voltage ($V_t$) does not depend on statistical fluctuations in dopant atom concentrations. The improved method and structure facilitate a future generation of sub 0.5 $\mu$m, uniform, and low threshold voltage ($V_t$) devices. The improved method and structure additionally facilitate an increased range of applications for sub-0.5 $\mu$m MOSFETs which include use in producing drivers and clock drivers with uniform characteristics and delays.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A dual-gated transistor on a substrate, comprising:
   a first source/drain region, a body region, and a second source/drain region, the body region having opposing sidewall surfaces, and wherein the body region includes a fully depleted structure;
   a first gate located on a first on one of the opposing sidewall surfaces; and
   a second gate located on a second one of the opposing sidewall surfaces, the dual-gated transistor formed by a method comprising:
   forming a first source/drain region on the substrate;
   vertically forming a body region on the first source/drain region, wherein vertically forming the body region includes vertically growing an epitaxial layer, such that the body region is formed as a high quality single crystalline structure, and wherein the body region is defined to have a width which is sufficiently thin, vis-a-vis a doping concentration (NA) of the body region such that a bulk charge (QB) is negligible in transistor operation;

forming a second source/drain region on the body region;

forming a first gate on a first one of the opposing sidewall surfaces, and separated by a first oxide; and forming a second gate on a second one of the opposing sidewall surfaces, and separated by a second oxide such that a threshold voltage for the transistor depends only on a thickness of the first and the second oxides and the width of the body region.

2. The dual-gated transistor of claim 1, wherein fabricating the dual-gated transistor on a substrate includes fabricating the dual-gated transistor on a p-type bulk silicon substrate.

3. The dual-gated transistor of claim 1, wherein forming the dual-gated transistor includes forming the body region, the first gate, and the second gate such that biasing the first and the second gates fully depletes the body region.

4. The dual-gated transistor of claim 1, wherein forming the first source/drain region includes forming the first source/drain region using ion implantation.

5. The dual-gated transistor of claim 1, wherein forming the first source/drain region includes vertically growing an epitaxial layer.

6. The dual-gated transistor of claim 1, wherein forming the first source/drain region includes using ion implantation and includes vertically growing an epitaxial layer.

7. A dual-gated transistor on a substrate, comprising:

a first source/drain region, a body region, and a second source/drain region, the body region having opposing sidewall surfaces, and wherein the body region includes a fully depleted structure;

a first gate located on a first one of the opposing sidewall surfaces; and a second gate located on a second one of the opposing sidewall surfaces, the dual-gated transistor formed by a method comprising:

forming a first source/drain region on the substrate;

vertically forming a body region on the first source/drain region, wherein vertically forming the body region includes vertically growing an epitaxial layer, such that the body region is formed as a high quality single crystalline structure by not growing across other neighboring surfaces, and wherein the body region is defined to have a width which is sufficiently thin, vis-a-vis a doping concentration (NA) of the body region such that a bulk charge (QB) is negligible in transistor operation;

forming a second source/drain region on the body region;

forming a first gate on a first one of the opposing sidewall surfaces; and forming a second gate on a second one of the opposing sidewall surfaces, wherein the body region, the first gate, and the second gate are formed such that biasing the first and the second gates fully depletes the body region.

8. A dual-gated transistor on a substrate, comprising:

a first source/drain region, a body region, and a second source/drain region, the body region having opposing sidewall surfaces, and wherein the body region includes a fully depicted structure;

a first gate located on a first one of the opposing sidewall surfaces; and a second gate located on a second one of the opposing sidewall surfaces, the dual-gated transistor formed by a method comprising:

vertically forming a body region extending outwardly form the substrate, wherein vertically forming the body region includes forming the body region as a single crystalline structure, such that the body region is not formed across neighboring surfaces, and wherein the body region is defined to have a width which is sufficiently thin, vis-a-vis a doping concentration (NA) of the body region such that bulk charge (QB) is negligible in transistor operation;

forming a first source/drain region adjacent to the body region;

forming a second source/drain region adjacent to the body region;

forming a first gate on a first one of the opposing sidewall surfaces; and forming a second gate on a second one of the opposing sidewall surfaces.

9. The dual-gated transistor of claim 8, wherein fabricating the dual-gated transistor on a substrate includes fabricating the dual-gated transistor on an insulator layer.

10. The dual-gated transistor of claim 8, wherein forming a first source/drain region adjacent to the body region includes encasing a portion of the body region with Arsenic silicate glass (ASG) and annealing the ASG.

11. The dual-gated transistor of claim 10, wherein encasing a portion of the body region with Arsenic silicate glass (ASG) includes depositing the ASG using chemical vapor deposition (CVD).

12. The dual-gated transistor of claim 8, wherein forming a first source/drain region adjacent to the body region includes encasing a portion of the body region with Borosilicate silicate glass (BSG) and includes annealing the BSG.

13. The dual-gated transistor of claim 12, wherein encasing a portion of the body region with Borosilicate silicate lass (BSG) includes depositing the BSG using chemical vapor deposition. (CVD).

14. A dual-gated transistor on a substrate, comprising:

a first source/drain region, a body region, and a second source/drain region, the body region having opposing sidewall surfaces, and wherein the body region includes a fully depleted structure;

a first gate located on a first one of the opposing sidewall surfaces; and a second gate located on a second one of the opposing sidewall surfaces, the dual-gated transistor formed by a method comprising:

vertically forming a body region extending outwardly from the substrate, wherein vertically forming the body region includes forming the body region as a single crystalline structure such that the body region is not formed across other surfaces, and includes etching the vertical body region to define such that the body region is defined to have width which is sufficiently thin, vis-a-vis a doping concentration (NA) of the body region such that a bulk charge (QB) is negligible in transistor operation;

forming a first source/drain region adjacent to the body region, wherein forming the first source/drain region adjacent to the body region includes encasing a portion of the body region with Arsenic silicate glass (ASG) and annealing the ASG;

forming a second source/drain region adjacent to the body region, wherein forming the second source/ drain region adjacent to the body region includes encasing a portion of the body region with Arsenic silicate glass (ASG) and annealing the ASG;

forming a first gate on a first one of the opposing sidewall surfaces; and forming a second gate on a second one of the opposing sidewall surfaces.

15. A dual-gated transistor on a substrate, comprising:

a first source/drain region, a body region, and a second source/drain region, the body region having opposing sidewall surfaces, and wherein the body region includes a single crystalline structure which is formed as a layer and etched such that the body region is not formed across neighboring surfaces;

a first gate located on a first one of the opposing sidewall surfaces; and a second gate located on a second one of the opposing sidewall surfaces, wherein the threshold voltage (Vt) for the dual-gated transistor is not dependent on bulk charge in the body region.

16. The dual-gated transistor of claim 15, wherein the body region of the dual-gated transistor is fully depleted by an applied bias on the first gate and the second gate.

17. The dual-gated transistor of claim 16, wherein the dual-gated transistor has a lower threshold voltage (Vt) fluctuation distribution than other metal-oxide-semiconductor field effect transistors (MOSFETs) having channel lengths of one (1) micrometer ($\mu$m) or less.

18. The dual-gated transistor of claim 15, wherein fabricating the dual-gated transistor on a substrate includes fabricating the dual-gated transistor on a p-type bulk silicon substrate.

19. The dual-gated transistor of claim 15, wherein forming the first source/drain region includes forming the first source/drain region using ion implantation.

20. The dual-gated transistor of claim 15, wherein forming the first source/drain region includes vertically growing an epitaxial layer.

21. A die, comprising:

a substrate; and a dual-gated transistor located on the substrate, the dual-gated transistor formed by a method comprising:

forming a first source/drain region on the substrate;

vertically forming a body region on the first source/drain region, wherein layer, such that the body region is formed as high quality single crystalline structure without forming across neighboring surfaces, and wherein the body region is defined to have a width which is sufficiently thin, vis-a-vis a doping concentration (NA) of the body region such that a bulk chate (QB) is negligible in transistor operation;

forming a second source/drain region on the body region;

forming a first gate on a first one of the opposing sidewall surfaces; and forming a second gate on a second one of the opposing sidewall surfaces, wherein the body region, the first gate, and the second gate are formed such that biasing the first and the second gates fully depletes the body region, and wherein the threshold voltage (Vt) for the dual-gated transistor is not dependent on bulk charge in the body region.

22. A dual-gated transistor on a substrate, comprising:

a first source/drain region, a body region, and a second source/drain region, the body region having opposing sidewall surfaces, and wherein the body region includes a single crystalline structure which is formed as a vertical layer such that the single crystalline structure is not formed across neighboring surfaces and wherein the vertical layer is etched to define a width to the body region which is sufficiently thin, vis-a-vis a doping concentration (NA) of the body region such that a bulk charge (QB) is negligible in transistor operation;

a first gate located on a first one of the opposing sidewall surfaces; and a second gate located on a second one of the opposing sidewall surfaces; and wherein the threshold voltage (Vt) for the dual-gated transistor is not dependent on bulk charge in the body region.

* * * * *

UNITED STATES PATENT AND TRADEMARK OFFICE
CERTIFICATE OF CORRECTION

PATENT NO. : 6,320,222 B1
DATED : November 20, 2001
INVENTOR(S) : Forbes et al.

It is certified that error appears in the above-identified patent and that said Letters Patent is hereby corrected as shown below:

Column 4,
Line 25, delete "ware" and insert -- wafer --, therefor.

Column 5,
Line 25, delete "serves" and insert -- serve --, therefor.
Line 36, delete "remove" and insert -- removed --, therefor.
Line 66, delete "illustration" and insert -- illustrating --, therefor.

Column 8,
Line 66, delete "structures" and insert -- structure is --, therefor.

Column 9,
Line 9, delete "a" and insert -- as --, therefor.
Line 32, delete "IN" and insert -- In --, therefor.

Column 10,
Line 65, delete "AN" and insert -- An --, therefor.

Column 11,
Line 10, delete "vie" and insert -- view --, therefor.
Line 17, delete "112f,includes" and insert -- 112f, includes --, therefor.

Column 12,
Line 2, delete "IN" and insert -- In --, therefor.

Column 14,
Line 60, delete "on one" and insert -- one --, therefor.

Column 16,
Line 7, delete "form" and insert -- from --, therefor.
Line 57, insert -- a -- after "have".

UNITED STATES PATENT AND TRADEMARK OFFICE
CERTIFICATE OF CORRECTION

PATENT NO. : 6,320,222 B1
DATED : November 20, 2001
INVENTOR(S) : Forbes et al.

It is certified that error appears in the above-identified patent and that said Letters Patent is hereby corrected as shown below:

Column 18,
Line 5, insert -- vertically forming the body region includes vertically growing an epitaxial -- after "wherein".
Line 10, delete "chate" and insert -- charge --, therefor.

Signed and Sealed this

Fourteenth Day of May, 2002

Attest:

JAMES E. ROGAN
Attesting Officer
Director of the United States Patent and Trademark Office